United States Patent
Kyozuka

(10) Patent No.: US 7,597,929 B2
(45) Date of Patent: Oct. 6, 2009

(54) METHOD OF MANUFACTURING A WIRING SUBSTRATE

(75) Inventor: Masahiro Kyozuka, Nagano (JP)

(73) Assignee: Shinko Electric Industries Co., Ltd., Nagano-shi (JP)

( * ) Notice: Subject to any disclaimer, the term of this patent is extended or adjusted under 35 U.S.C. 154(b) by 421 days.

(21) Appl. No.: 11/702,587

(22) Filed: Feb. 6, 2007

(65) Prior Publication Data

US 2007/0190237 A1 Aug. 16, 2007

(30) Foreign Application Priority Data

Feb. 10, 2006 (JP) .............................. 2006-033667

(51) Int. Cl.
*B05D 5/12* (2006.01)

(52) U.S. Cl. ............... 427/96.1; 427/97.2; 427/97.3; 427/97.7; 427/99.4; 427/117

(58) Field of Classification Search ............... 427/96.1, 427/97.2, 97.3, 97.7, 99.4, 117
See application file for complete search history.

(56) References Cited

U.S. PATENT DOCUMENTS

| | | | |
|---|---|---|---|
| 6,495,394 B1 * | 12/2002 | Nakata et al. ............ | 438/107 |
| 6,736,988 B1 | 5/2004 | Gaku et al. | |
| 6,768,064 B2 * | 7/2004 | Higuchi et al. ............ | 174/267 |
| 2003/0157307 A1 * | 8/2003 | Suzuki et al. ............ | 428/209 |
| 2004/0178492 A1 * | 9/2004 | Tsukamoto et al. ........ | 257/690 |
| 2006/0219428 A1 * | 10/2006 | Chinda et al. ............ | 174/257 |
| 2006/0237225 A1 * | 10/2006 | Kariya et al. ............ | 174/260 |
| 2007/0080329 A1 * | 4/2007 | Nomiya et al. ............ | 252/500 |
| 2007/0166944 A1 * | 7/2007 | Japp et al. ............ | 438/396 |
| 2007/0169960 A1 * | 7/2007 | Hayashi ............ | 174/262 |

FOREIGN PATENT DOCUMENTS

| | | |
|---|---|---|
| JP | 2001-135911 | 5/2001 |
| JP | 2003-168868 | 6/2003 |

* cited by examiner

*Primary Examiner*—Binh X Tran
(74) *Attorney, Agent, or Firm*—Kratz, Quintos & Hanson, LLP

(57) ABSTRACT

A method of manufacturing a wiring substrate of the present invention includes the steps of, preparing a laminated body having such a structure that a peelable metal foil in which a lower metal foil and an upper metal foil are laminated peelably and an opening portion is provided on a peripheral side is pasted onto a supporting body, forming a through hole having a diameter smaller than the opening portion by processing a portion of the supporting body on an inner side of the opening portion to obtain a reference hole having a projection portion in an inside, forming a resin layer on the peelable metal foil and the projection portion in the reference hole to cover a side surface of the opening portion, and then forming a build-up wiring on the resin layer, removing portions of the build-up wiring and the laminated body corresponding to an area containing the opening portion to expose a peeling boundary of the peelable metal foil, peeling the upper metal foil from the lower metal foil at a boundary to separate the upper metal foil and the build-up wiring from the supporting body side, and removing the upper metal foil from the build-up wiring.

10 Claims, 19 Drawing Sheets

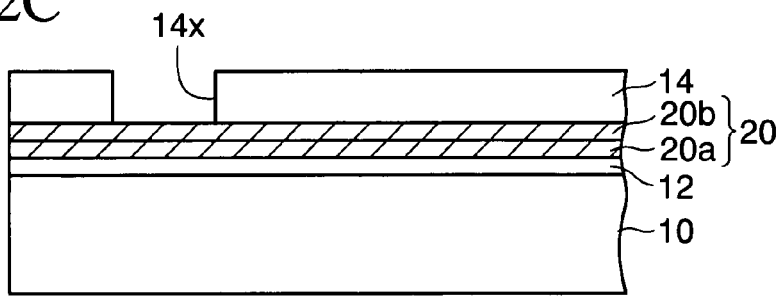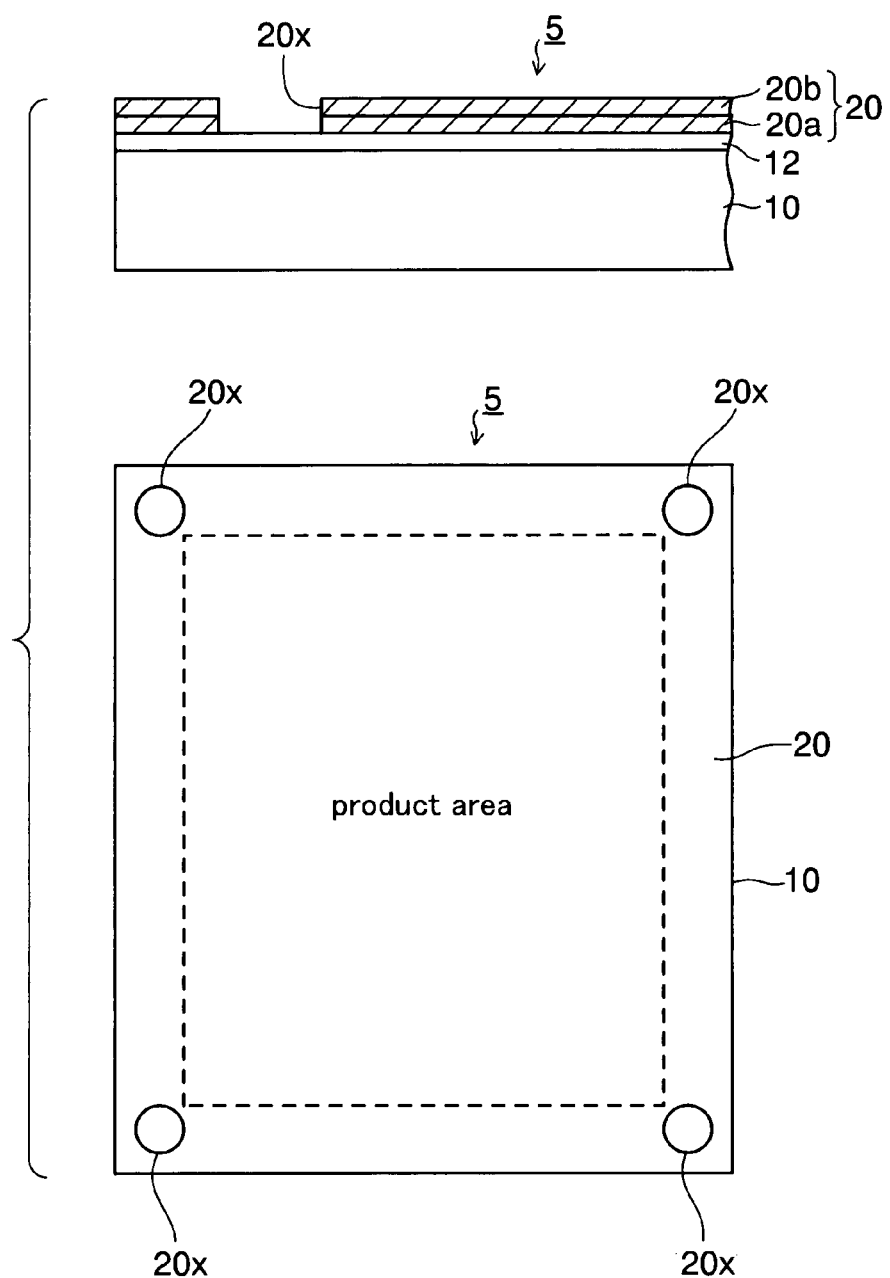

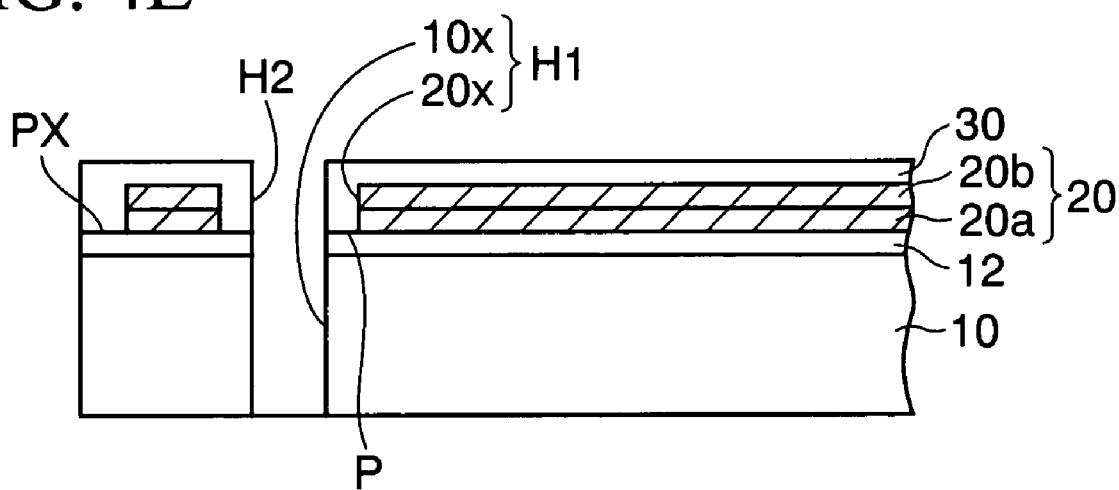
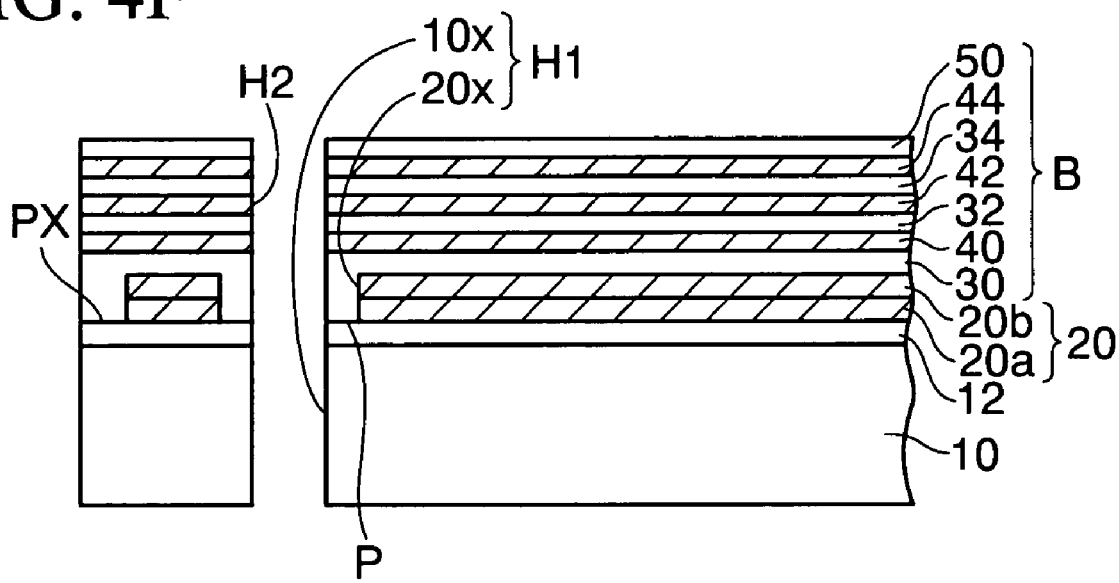

METHOD OF MANUFACTURING A WIRING SUBSTRATE

CROSS-REFERENCE TO RELATED APPLICATIONS

This application is based on and claims priority of Japanese Patent Application No. 2006-033667 filed on Feb. 10, 2006, the entire contents of which are incorporated herein by reference.

BACKGROUND OF THE INVENTION

1. Field of the Invention

The present invention relates to a method of manufacturing a wiring substrate and, more particularly, a method of manufacturing a wiring substrate that is applicable to a thin mounting substrate on which an electronic component is mounted.

2. Description of the Related Art

In the prior art, as a method of manufacturing a wiring substrate, there is the method of obtaining the thin wiring substrate by stacking the carrier-lined copper foil, which is constructed by temporarily adhering the copper foil peelably onto the carrier copper foil, on the substrate, forming the build-up wiring thereon, and peeling the copper foil from the carrier copper foil to separate them at the boundary.

In Patent Literature 1 (Patent Application Publication (KOKAI) 2003-168868), there is set forth the method of forming the laminated body by laminating the carrier-lined copper foil, which is formed by stacking the carrier on the copper foil, on the inner layer circuit substrate, then forming through holes in the laminated body, then applying the plating to electrically connect front and back sides, and then removing the carrier together with the plated film on the carrier.

Also, in Patent Literature 2 (Patent Application Publication (KOKAI) 2001-135911), there is set forth the method of forming through holes in the copper-clad laminate, which is laminated/formed by using at least the copper foil whose double sides are processed as the outer layer, quickly by the carbon dioxide gas laser with good productivity.

In the method of manufacturing the wiring substrate in the prior art, as shown in FIGS. 1A and 1B, a carrier-lined copper foil 400 constructed by lining a copper foil 300 with a carrier copper foil 200 is laminated on a substrate 100, and then reference holes 500 passing through the carrier-lined copper foil 400 and the substrate 100 are formed in the peripheral portion by the drilling, or the like. The reference holes 500 are provided at four corners on the outside of a product area before a build-up wiring is formed, and are used for alignment or conveyance at the time of forming the build-up wiring.

In this case, since the peeling boundary of the carrier-lined copper foil 400 exposed from the side surface of the reference hole 500 has incurred mechanical damage, the peeling is often caused partially on the peeling boundary, or the peeling boundary is often brought into the easy-peel condition. Therefore, there is a possibility that, because chemicals used in the subsequent wet process to form the build-up wiring sink into the boundary, the peeling of the carrier-lined copper foil 400 spreads. And it acts as the factor to bring about a reduction in production yield. Also, since the carrier-lined copper foil is cut in a predetermined dimension to fit in with the supporting body, such a situation is supposed that the outer peripheral portion of the carrier-lined copper foil 400 is also brought into the easy-peel condition. Thus, in some cases, the similar measures must be taken.

SUMMARY OF THE INVENTION

It is an object of the present invention to provide a method of manufacturing a wiring substrate capable of preventing peeling at a side surface of a reference hole or an outer peripheral portion of a peelable metal foil, in the method of manufacturing a wiring substrate in which the peelable metal foil is laminated on the supporting body, then through holes are formed to pass through them, and then the build-up wiring is formed.

The invention relates to a method of manufacturing a wiring substrate, it includes the steps of preparing a laminated body having such a structure that a peelable metal foil in which a lower metal foil and an upper metal foil are laminated peelably and an opening portion is provided on a peripheral side is pasted onto a supporting body; forming a through hole having a diameter smaller than the opening portion by processing a portion of the supporting body on an inner side of the opening portion to get a reference hole having a projection portion in an inside; forming a resin layer on the peelable metal foil and the projection portion in the reference hole to cover a side surface of the opening portion, and forming a build-up wiring constructed to contain the resin layer; removing portions of the build-up wiring and the laminated body corresponding to an area containing the opening portion to expose a peeling boundary of the peelable metal foil; peeling the upper metal foil from the lower metal foil at a boundary to separate the upper metal foil and the build-up wiring from the supporting body side; and removing the upper metal foil from the build-up wiring.

In the present invention, first, the laminated body having such a structure that the peelable metal foil which is peelable at the boundary and in which the opening portion is provided in the peripheral portion is pasted onto the supporting body is prepared. In order to obtain the laminated body, the peelable metal foil in which the opening portion is provided may be pasted onto the supporting body, or the peelable metal foil may be pasted onto the supporting body and then the peelable metal foil may be patterned to form the opening portion.

Then, the through hole that is smaller in diameter than the opening portion is formed in the portion of the supporting body on the inner side of the opening portion of the peelable metal foil. Thus, the reference hole to the inside of which the projection portion is provided can be obtained.

Then, the resin layer is formed on the peelable metal foil and the projection portion of the reference hole to cover/protect the side surface (peeling boundary) of the opening portion, and then the build-up wiring is formed. At this time, since the side surface of the opening portion of the peelable metal foil is protected by the resin layer, the chemicals applied in the wet process in forming the build-up wiring never sink into the peeling boundary of the peelable metal foil even when the side surface is going to peel due to the damage applied by the machining. Thus, the peeling of the peelable metal foil can be prevented.

Then, the portions of the build-up wiring and the laminated body in the neighborhood of the opening portion of the peelable metal foil are removed to expose the peeling boundary of the peelable metal foil. Then, the upper metal foil and the build-up wiring are separated from the supporting body side by peeling the upper metal foil from the lower metal foil at the peeling boundary, and then the upper metal foil is removed from the build-up wiring.

As described above, the peeling of the peelable metal foil can be prevented in forming the build-up wiring, and also the peelable metal foil can be peeled easily at the boundary after the build-up wiring is formed. As a result, the thin wiring substrate can be manufactured with good yield.

Further, since the peelable metal foil is cut to coincide with a size of the supporting body, such a situation may be supposed that the outer peripheral portion is peeled by the mechanical damage. In this case, the outer peripheral portion of the peelable metal foil is arranged to retreat inward from the outer peripheral portion of the supporting body such that the outer peripheral portion of the supporting body constitutes the projection portion at the time of pasting the peelable metal foil on the supporting body. Then, the side surface of the outer peripheral portion of the peelable metal foil is also covered with the resin layer at the time of forming the resin layer, and then the build-up wiring and the laminated body in the area containing the projection portion of the supporting body are further removed. Thus, the peelable metal foil can be peeled at the boundary.

By doing these processes, the peeling can be prevented not only in the opening portion of the peelable metal foil but also in the outer peripheral portion.

Also, the invention relates to a method of manufacturing a wiring substrate, it includes the steps of obtaining a laminated body by pasting a peelable metal foil constructed by laminating an upper metal foil and a lower metal foil in a peelable state onto a supporting body; forming a pressure-bonded portion by thermally bonding a predetermined portion on a peripheral side of the peelable metal foil selectively; forming a reference hole passing through the laminated body, by processing a portion of the laminated body on an inner side of the pressure-bonded portion such that a peripheral side of the pressure-bonded portion is left; forming a build-up wiring on the peelable metal foil; removing portions of the build-up wiring and the laminated body corresponding to an area containing the pressure-bonded portion to expose a peeling boundary of the peelable metal foil; peeling the upper metal foil from the lower metal foil at a boundary to separate the upper metal foil and the build-up wiring from the supporting body side; and removing the upper metal foil from the build-up wiring.

In the present invention, instead of such a process that the opening portion of the peelable metal foil is coated/protected with the resin layer, the pressure-bonded portion is formed previously in the area that is one size larger than the portion of the peelable metal foil in which the reference hole is formed. Accordingly, since the processed surface of the peelable metal foil is adhered perfectly at the time of forming the reference hole by the machining, such processed surface never peels unlike the case where other temporarily adhered portion is processed by the machining. Therefore, there is no possibility that the chemicals applied in the wet process in forming the build-up wiring sinks into the boundary of the peelable metal foil, and the peeling of the peelable metal foil can be prevented.

Also, the peeling boundary of the peelable metal foil is exposed by removing the portions of the build-up wiring and the laminated body in the area containing the pressure-bonded portion of the peelable metal foil after the build-up wiring is formed. Also, the upper metal foil and the build-up wiring are separated from the supporting body side by peeling the upper metal foil from the lower metal foil at the peeling boundary, and the upper metal foil is removed from the build-up wiring.

As described above, when the peeling on the outer peripheral portion of the peelable metal foil should be prevented, the outer peripheral pressure-bonded portion may be further formed in the outer peripheral portion of the peelable metal foil. In this case, the outer peripheral pressure-bonded portion is also cut/removed at the time of removing the pressure-bonded portion of the peelable metal foil after the build-up wiring is formed, and thus the peeling boundary of the peelable metal foil is also exposed from the outer peripheral portion and the peelable metal foil is brought into the peelable condition.

As described above, according to the present invention, upon forming the reference holes in the laminated body being formed by pasting the peelable metal foil onto the supporting body and then forming the build-up wiring, the peelable metal foil on the side surface of the reference hole can be prevented from peeling off the boundary, and thus a production yield can be improved.

BRIEF DESCRIPTION OF THE DRAWINGS

FIGS. 2A to 2K are sectional views (including plan views in part) showing a method of manufacturing a wiring substrate according to a first embodiment of the present invention, wherein FIG. 2A corresponds to an enlarged sectional view taken along a line I-I in FIG. 2B;

FIGS. 4A to 4I are sectional views (including plan views in part) showing a method of manufacturing a wiring substrate according to a third embodiment of the present invention, wherein FIG. 4A corresponds to an enlarged sectional view taken along a line III-III in FIG. 4B;

DETAILED DESCRIPTION OF THE PREFERRED EMBODIMENTS

Embodiments of the present invention will be explained with reference to the accompanying drawings hereinafter.

First Embodiment

Figure 1A:
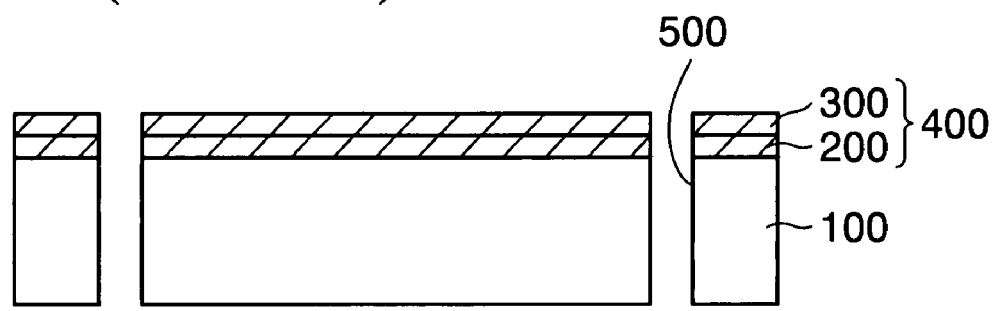
FIGS. 1A and 1B are a sectional view and a plan view showing the state that reference holes are formed in a laminated body in a method of manufacturing a wiring substrate in the prior art.
Figure 1B:
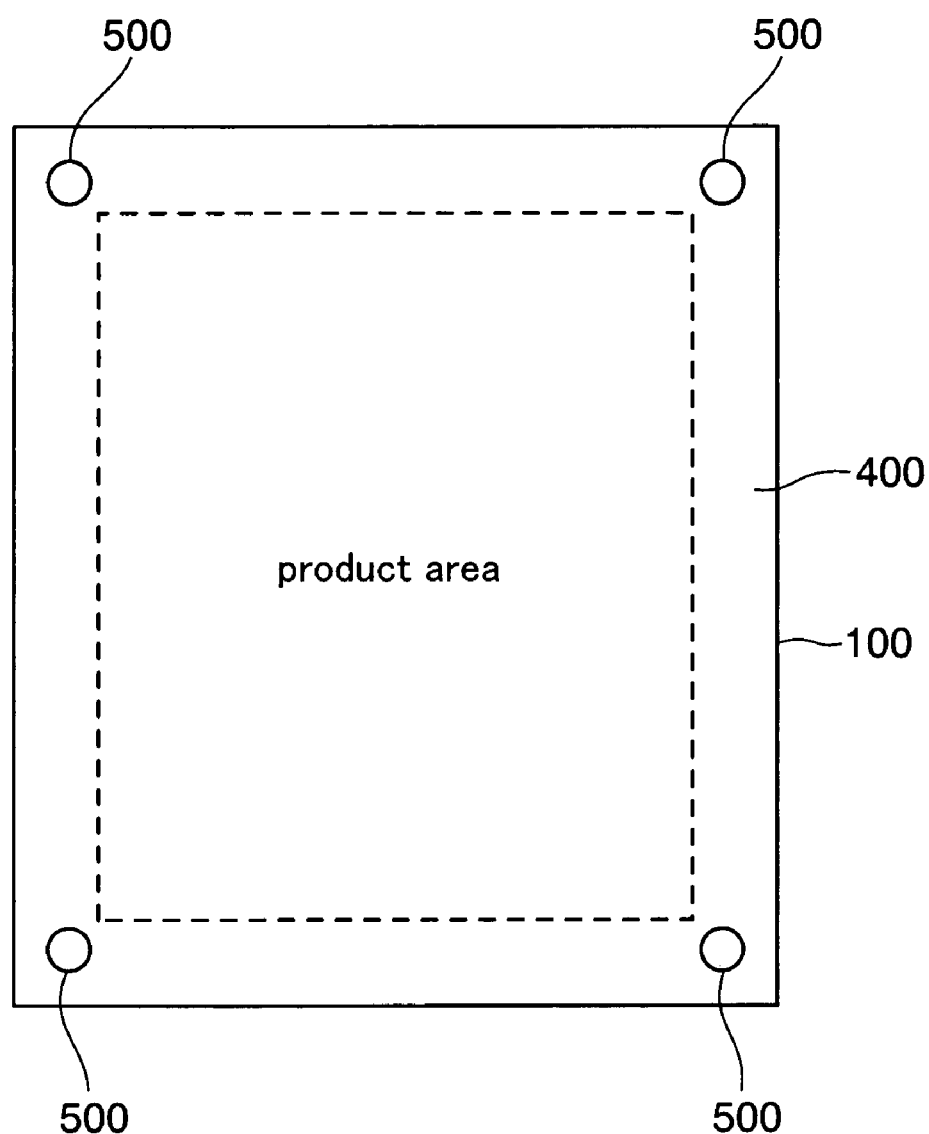
Figure 2A:
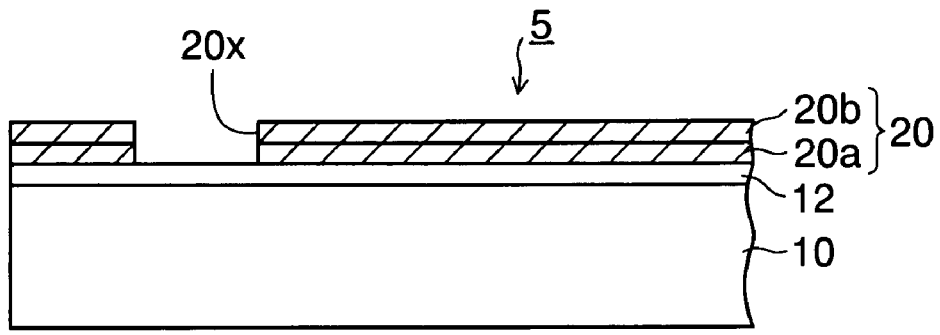

FIGS. 2A to 2K are views showing a method of manufacturing a wiring substrate according to a first embodiment of the present invention. In the method of manufacturing the wiring substrate according to the first embodiment of the present invention, as shown in FIG. 2A, first, a supporting body 10 made of a glass epoxy resin and a carrier-lined copper foil 20 (peelable metal foil) to the peripheral portion of which opening portions 20x are provided are prepared. The carrier-lined copper foil 20 is constructed by a carrier copper foil 20a (upper metal foil), and a copper foil 20b (lower metal foil) temporarily adhered onto the carrier copper foil 20a in a peelable condition. Also, with reference to FIG. 2B together with FIG. 2A, the carrier-lined copper foil 20 is cut in a predetermined size to fit in with the supporting body 10, and the opening portions 20x are provided at four corners in the peripheral portion. The opening portions 20x in the carrier-lined copper foil 20 are formed by the punching using the die, or the like, and are set one size larger in diameter than through holes formed in the supporting body 10, explained later. A thickness of the copper foil 20b of the carrier-lined copper foil 20 is about 30 µm, for example.

Also, as shown in FIG. 2A, the carrier-lined copper foil 20 in which the opening portions 20x are formed is arranged on the supporting body 10 via an adhesive resin layer 12 made of a semi-cured thermosetting resin, or the like to direct the copper foil 20b side upward, and then the adhesive resin layer 12 is cured by pressing while applying a thermal treatment at a temperature of about 170° C. Thus, the carrier-lined copper foil 20 is pasted onto the supporting body 10.

Figure 2B:
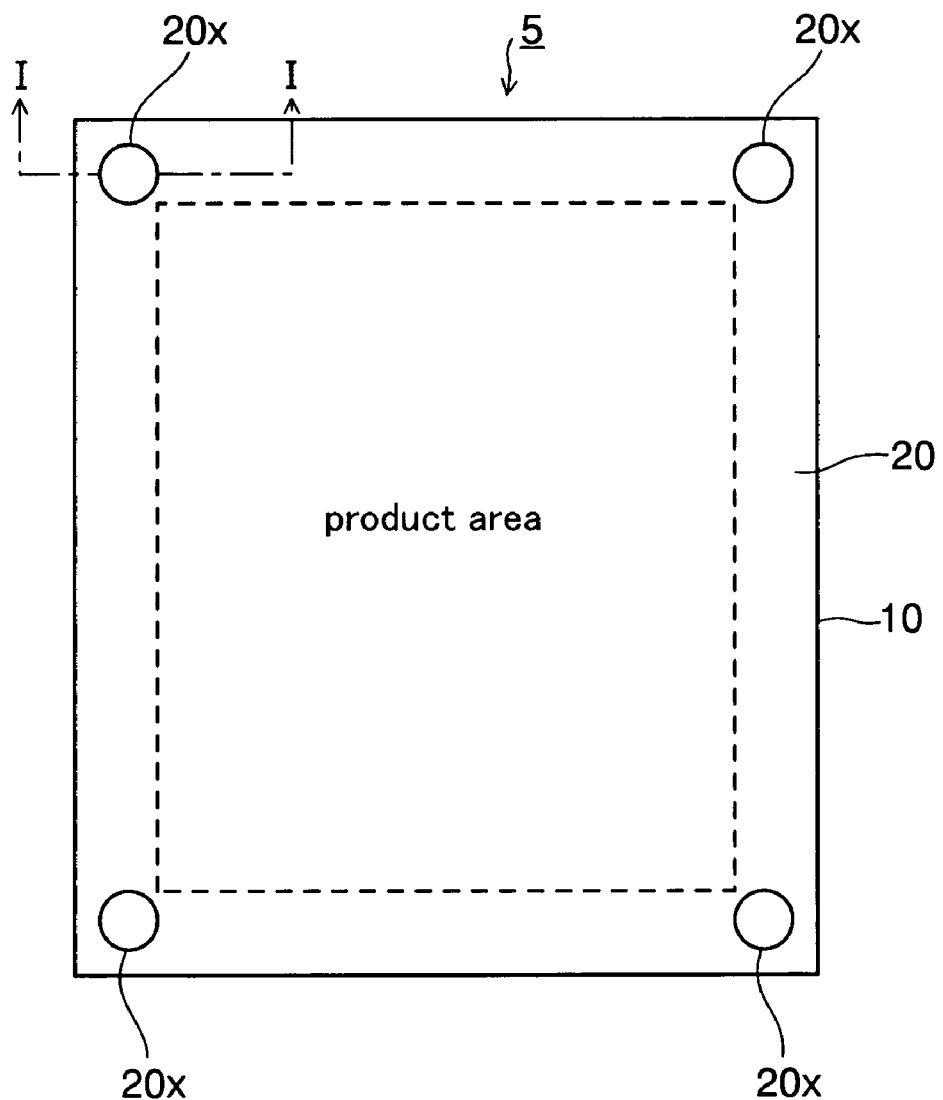

Accordingly, a laminated body 5 in which the carrier-lined copper foil 20 is laminated on the supporting body 10 via the adhesive resin layer 12 is obtained. As shown in FIG. 2B, when an overall configuration of the laminated body 5 is viewed from the top side, a product area is defined in a center main portion of the laminated body 5 and the opening portions 20x of the carrier-lined copper foil 20 are arranged at four corners on the outside of the product area.

Another forming method of the opening portions 20x of the carrier-lined copper foil 20 is shown in FIGS. 2C and 2D. As shown in FIG. 2C, first the carrier-lined copper foil 20 is pasted onto the supporting body 10 via the adhesive resin layer 12, and then a resist film 14 having an opening portion 14x therein is formed on the carrier-lined copper foil 20. Then, the opening portions 20x are formed in the carrier-lined copper foil 20 by etching the carrier-lined copper foil 20 through the opening portion 14x in the resist film 14. Then, the resist film 14 is removed. Accordingly, as shown in FIG. 2D, the laminated body 5 having the similar structure to that in FIGS. 2A and 2B is obtained.

Figure 2E:
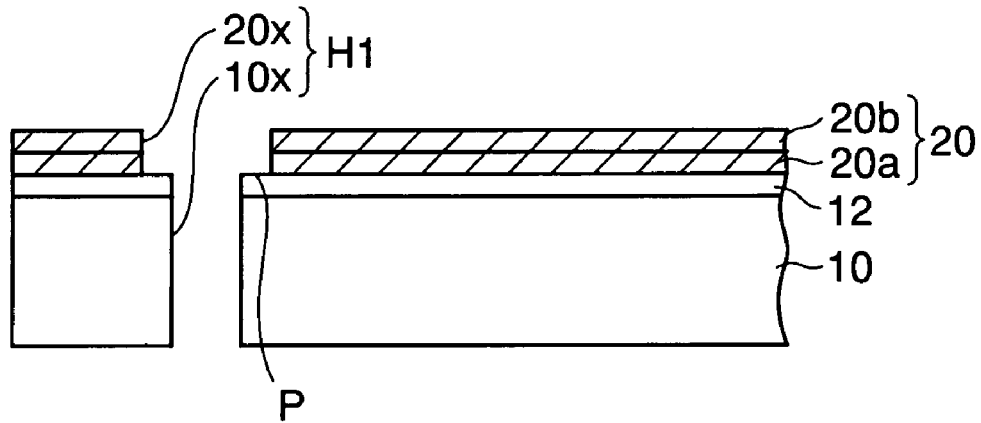
Figure 2F:
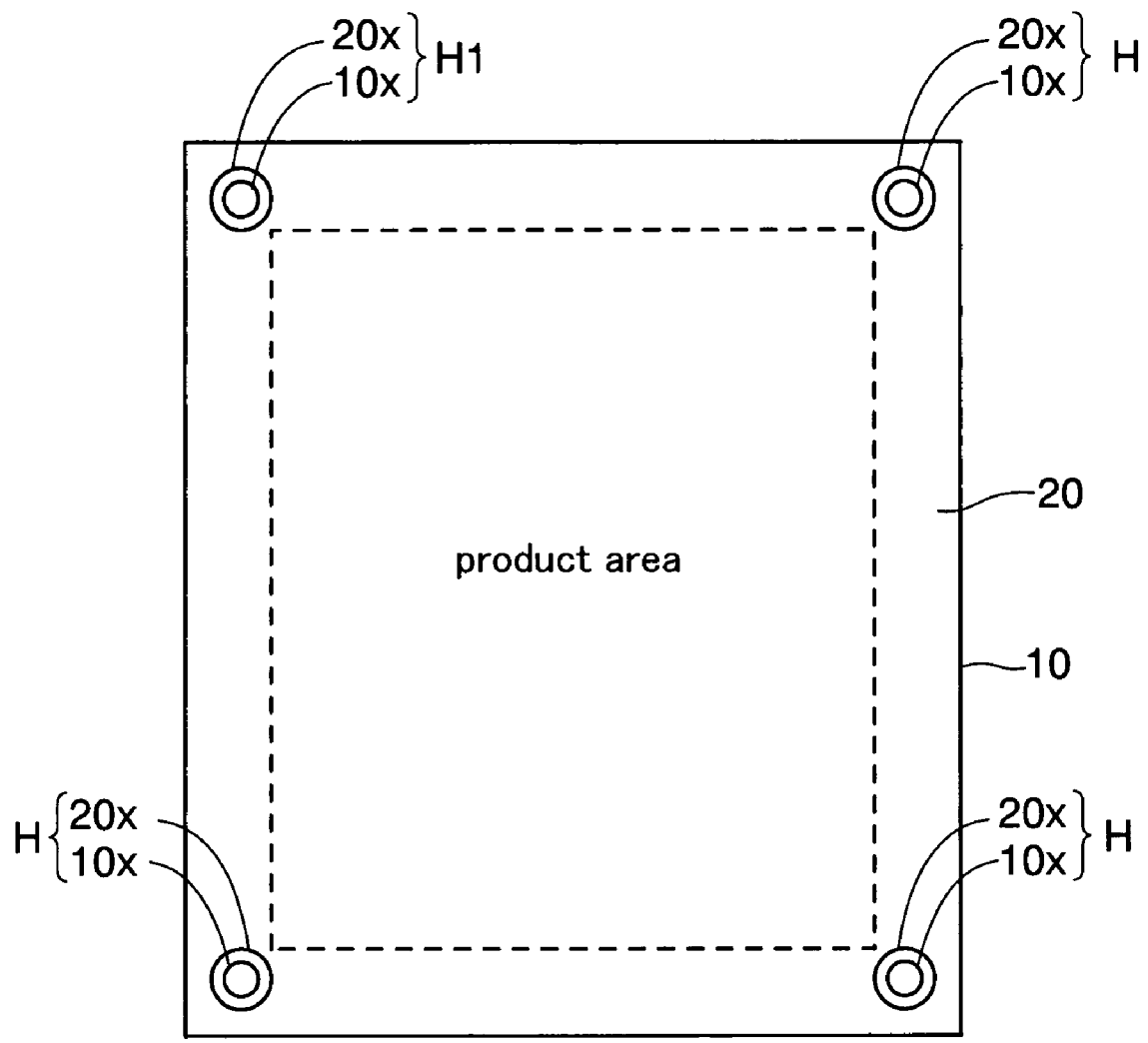

Then, as shown in FIG. 2E, portions of the adhesive resin layer 12 and the supporting body 10 on the inner side of the opening portions 20x in the carrier-lined copper foil 20 are processed by the drill, or the like. Thus, through holes 10x that are one size larger in diameter than the opening portions 20x in the carrier-lined copper foil 20 is formed. As shown in FIG. 2F, when the overall structure of the laminated body 5 is viewed from the top side, the through holes 10x are formed on the inner side of respective opening portions 20x in the carrier-lined copper foil 20 arranged at four corners of the supporting body 10, respectively. For example, a diameter of the opening portion 20x in the carrier-lined copper foil 20 is set to about 2 mm, and a diameter of the through hole 10x in the supporting body 10 is set to a diameter smaller than that of the opening portion 20x by about 100 µm. Therefore, the opening portion 20x in the carrier-lined copper foil 20 is arranged in a position to shift outward from the through hole 10x in the supporting body 10, and a projection portion P is provided on the inside of the opening portion 20x. Thus, a first reference hole H1 constructed stepwise by the through hole 10x and the opening portion 20x is obtained at four corners of the laminated body 5 on the outside of the product area. The first reference holes H1 are used for alignment and conveyance at the time of forming the build-up wiring on the carrier-lined copper foil 20 later.

At this time, mechanical damage is caused in the side surfaces of the opening portions 20x in the carrier-lined copper foil 20 particularly in the case that the opening portions are formed by the punching. Therefore, the carrier copper foil 20a and the copper foil 20b exposed from the side surface of the first reference holes H1 are brought into the easily peelable condition at their boundary.

Figure 2G:
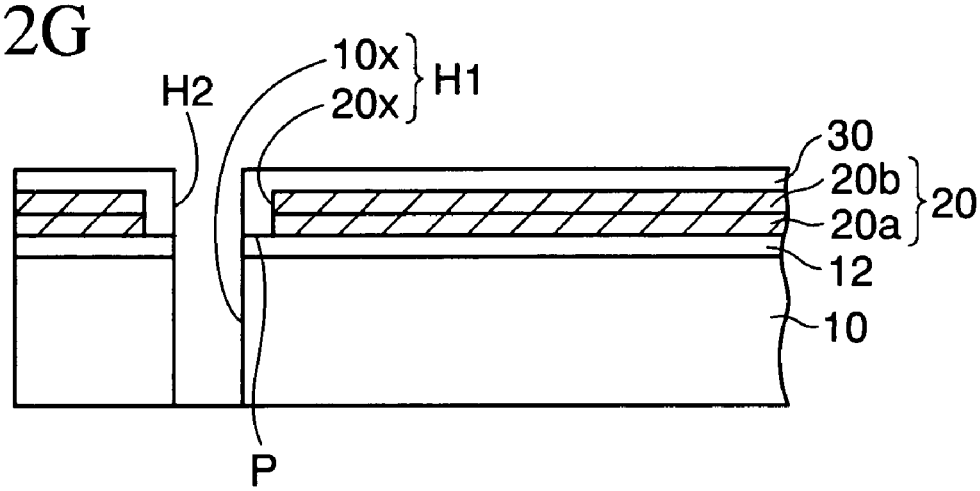

Then, as shown in FIG. 2G, a first resin layer 30 is formed on the carrier-lined copper foil 20. At this time, the first resin layer 30 is formed on the first reference hole H1 such that a second reference hole H2 is opened to communicate with the through hole 10x, and the first resin layer 30 is formed on the projection portion P of the first reference hole H1 such that the side surface of the opening portion 20x in the carrier-lined copper foil 20 is covered.

In this manner, the side surface of the opening portion 20x in the carrier-lined copper foil 20 is covered/protected with the first resin layer 30 in a state that the second reference hole H2 is opened.

Figure 2H:
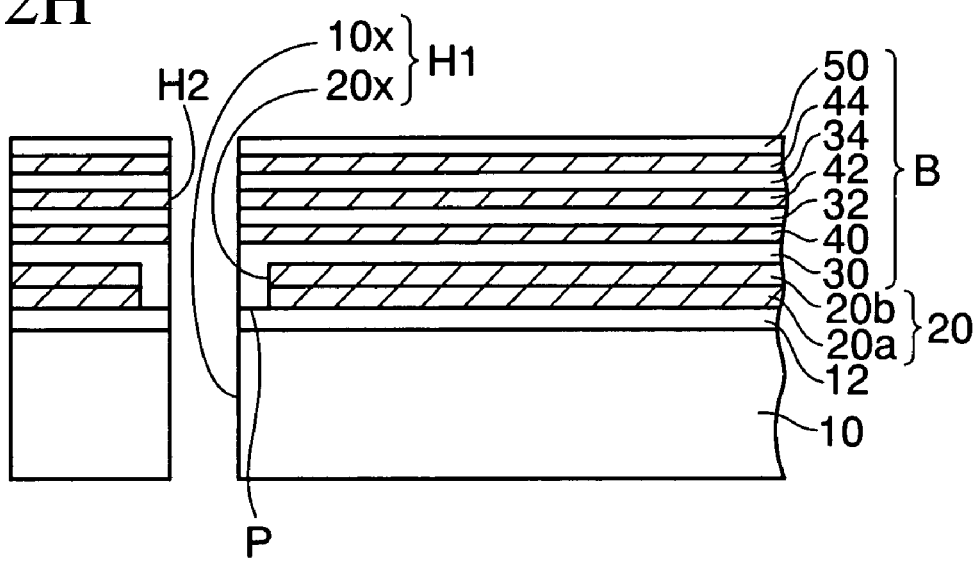

Then, as shown in FIG. 2H, a first wiring layer 40 is formed on the first resin layer 30, and a second resin layer 32 is formed on the first wiring layer 40. Then, a second wiring layer 42 is formed on the second resin layer 32, and a third resin layer 34 is formed on the second wiring layer 42. Then, a third wiring layer 44 is formed on the third resin layer 34, and a solder resist film 50 is formed on the third wiring layer 44. Accordingly, a build-up wiring B is formed on the carrier-lined copper foil 20. The second reference holes H2 are maintained through respective steps because the resin layer and the wiring layer are formed to open the second reference holes H2 respectively. Then, the second reference holes H2 are utilized as an object for alignment and conveyance in respective steps.

In FIG. 2H, only the surrounding portion of the second reference hole H2 is illustrated. In the product area explained in FIG. 2B, and the like, the first to third wiring layers 40, 42, 44 are formed such that they are patternized and also connected mutually through via holes (not shown) formed in the first to third resin layers 30, 32, 34. As the forming method, via holes are formed on the portions of the resin layer on the lower wiring layer, and then the upper wiring layer connected to the lower wiring layer through the via holes is formed on the resin layer by the semi-additive process, or the like. In an example in FIG. 2H, the three-layered build-up wiring B is formed on the carrier-lined copper foil 20, but an n-layered (n is an integer of 1 or more) build-up wiring may be formed and the number of layers may be set arbitrarily.

Various wet processes are employed in the step of forming the build-up wiring B. However, the side surfaces of the opening portions 20x in the carrier-lined copper foil 20 are covered/protected with the first resin layer 30. Therefore, since there is no possibility that the chemicals sink into the peeling boundary of the carrier-lined copper foil 20, separation between the carrier copper foil 20a and the copper foil 20b can be prevented.

Figure 2I:
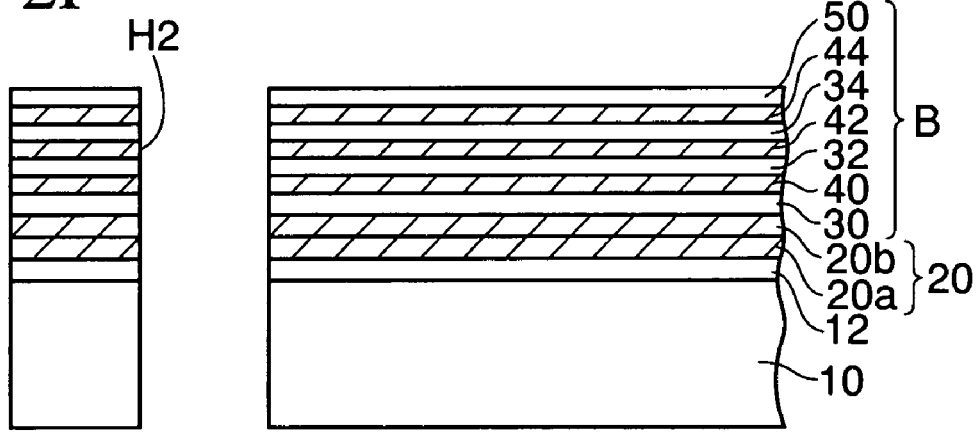

Then, the portion of the structural body in FIG. 2H corresponding to the area containing the opening portion 20x in the carrier-lined copper foil 20 is processed/removed by the drill, or the like. Thus, as shown in FIG. 2I, the second reference hole H2 is enlarged in diameter. Accordingly, since the peeling boundary of the carrier-lined copper foil 20 is exposed from the side surface of the second reference hole H2, the copper foil 20b can be easily peeled off the carrier copper foil 20a at the boundary.

Figure 2J:
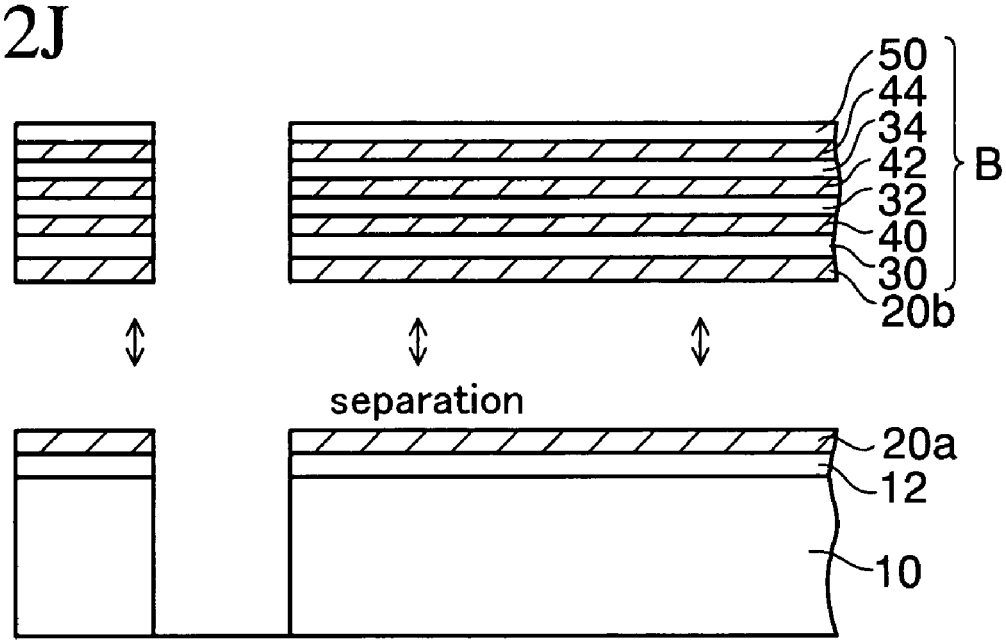
Figure 2K:
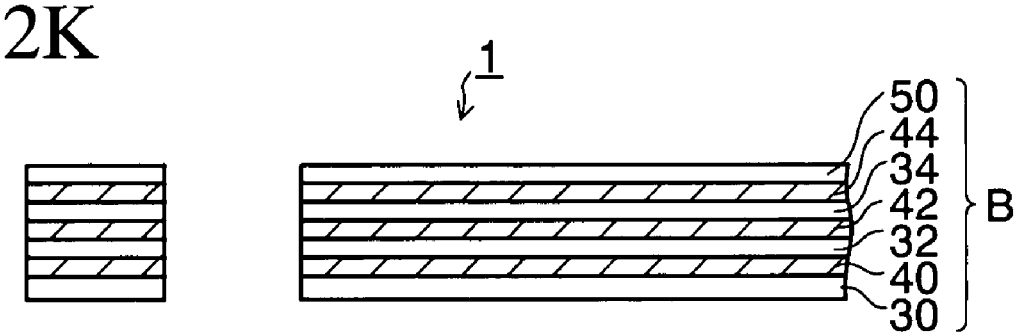

Then, as shown in FIG. 2J, the copper foil 20b and the build-up wiring B are separated from the supporting body 10 side by peeling the copper foil 20b from the carrier copper foil 20a of the carrier-lined copper foil 20 at the boundary. Then, as shown in FIG. 2K, the copper foil 20b is removed from the build-up wiring B by the wet etching. Also, when a plurality of wiring substrate areas are defined in the product area, the wiring substrate is divided such that individual wiring substrates can be obtained.

With the above, a wiring substrate 1 according to the present embodiment is manufactured.

As described above, according to the method of manufacturing the wiring substrate of the present embodiment, first, the first reference holes H1 are formed by setting such that the opening portions 20x in the carrier-lined copper foil 20 is one size larger than the through holes 10x in the supporting body 10, when the reference holes passing through the laminated body 5 are provided in the peripheral portion of the laminated body 5 in which the carrier-lined copper foil 20 is pasted on the supporting body 10.

Then, the first resin layer 30 is formed on the carrier-lined copper foil 20 such that the side surfaces of the opening portions 20x of the carrier-lined copper foil 20 are covered with the first resin layer 30. Thus, the side surfaces of the opening portions 20x of the carrier-lined copper foil 20 are protected by the first resin layer 30. As a result, the chemicals applied in the wet process in forming the build-up wiring B never sink into the peeling boundary of the carrier-lined copper foil 20, and the peeling of the carrier-lined copper foil 20 can be prevented.

Then, the predetermined build-up wiring B is formed on the carrier-lined copper foil 20. Then, the portions of the build-up wiring B corresponding to the opening portions 20x in the carrier-lined copper foil 20 are removed to expose the peeling boundary of the carrier-lined copper foil 20.

Then, the copper foil 20b and the build-up wiring B are separated from the supporting body 10 by peeling the copper foil 20b from the carrier copper foil 20a at the boundary. Then, the copper foil 20b is removed from the build-up wiring B.

In this manner, in the present embodiment, the peeling of the carrier-lined copper foil 20 can be prevented in forming the build-up wiring B, and also the carrier-lined copper foil 20 can be peeled easily at the peeling boundary after the build-up wiring B is formed. As a result, the thin wiring substrate can be manufactured with good yield.

In this case, the wiring substrate 1 of the present embodiment may be mounted on a stiffener (heat radiation plate), as occasion demands. In addition, recess portions may be formed in the copper foil 20b of the carrier-lined copper foil 20 before the first resin layer 30 is formed, and then electrodes may be formed in the recess portions by plating a gold, a solder, or the like such that the electrodes are connected to the first wiring layer 40. In this case, the electrodes are exposed by removing the copper foil 20b in the step in FIG. 2K to act as the bumps, and then the electronic component (semiconductor chip) is mounted on the wiring layers in the opening portions in the uppermost solder resist film 50 in the product area.

Second Embodiment

FIGS. 3A to 3J are views showing a method of manufacturing a wiring substrate according to a second embodiment of the present invention. A feature of the second embodiment is that the portions of carrier-lined copper foil in which the reference holes are formed and their neighboring portions are adhered perfectly in advance. In the second embodiment, detailed explanation of the same steps as those in the first embodiment will be emitted.

Figure 3A:
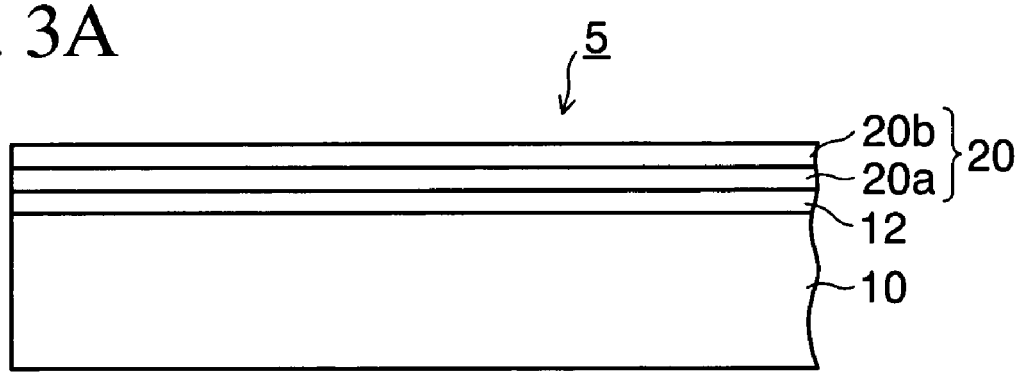
FIGS. 3A to 3J are sectional views (including plan views in part) showing a method of manufacturing a wiring substrate according to a second embodiment of the present invention, wherein FIG. 3C corresponds to an enlarged sectional view taken along a line II-II in FIG. 3B.
Figure 3B:
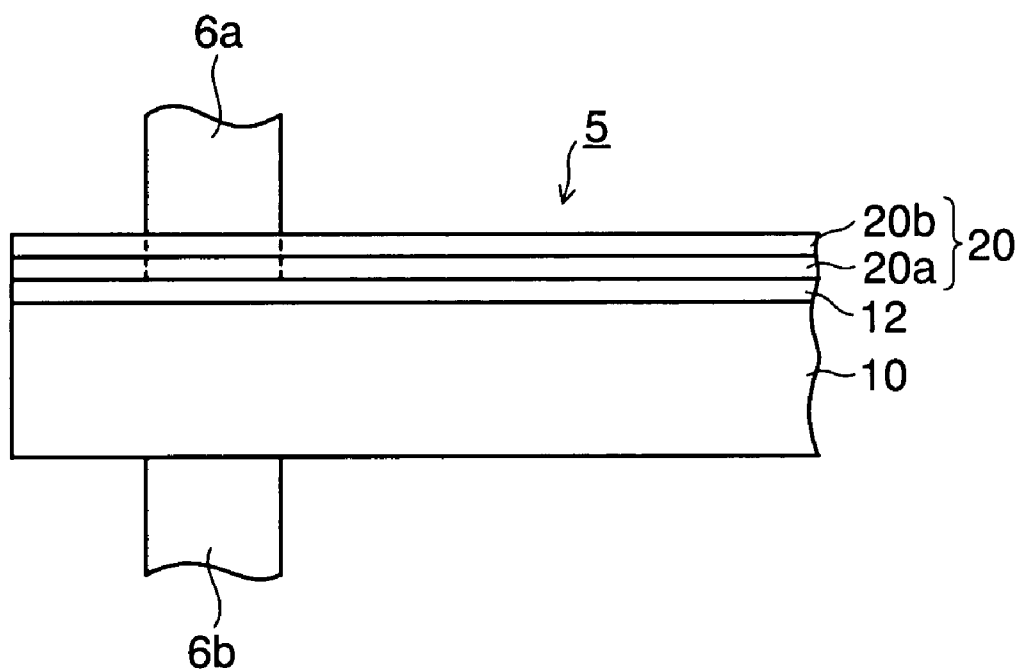
Figure 3C:
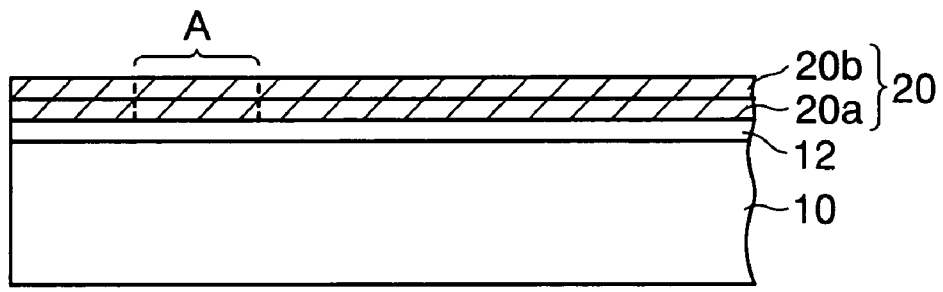
Figure 3D:
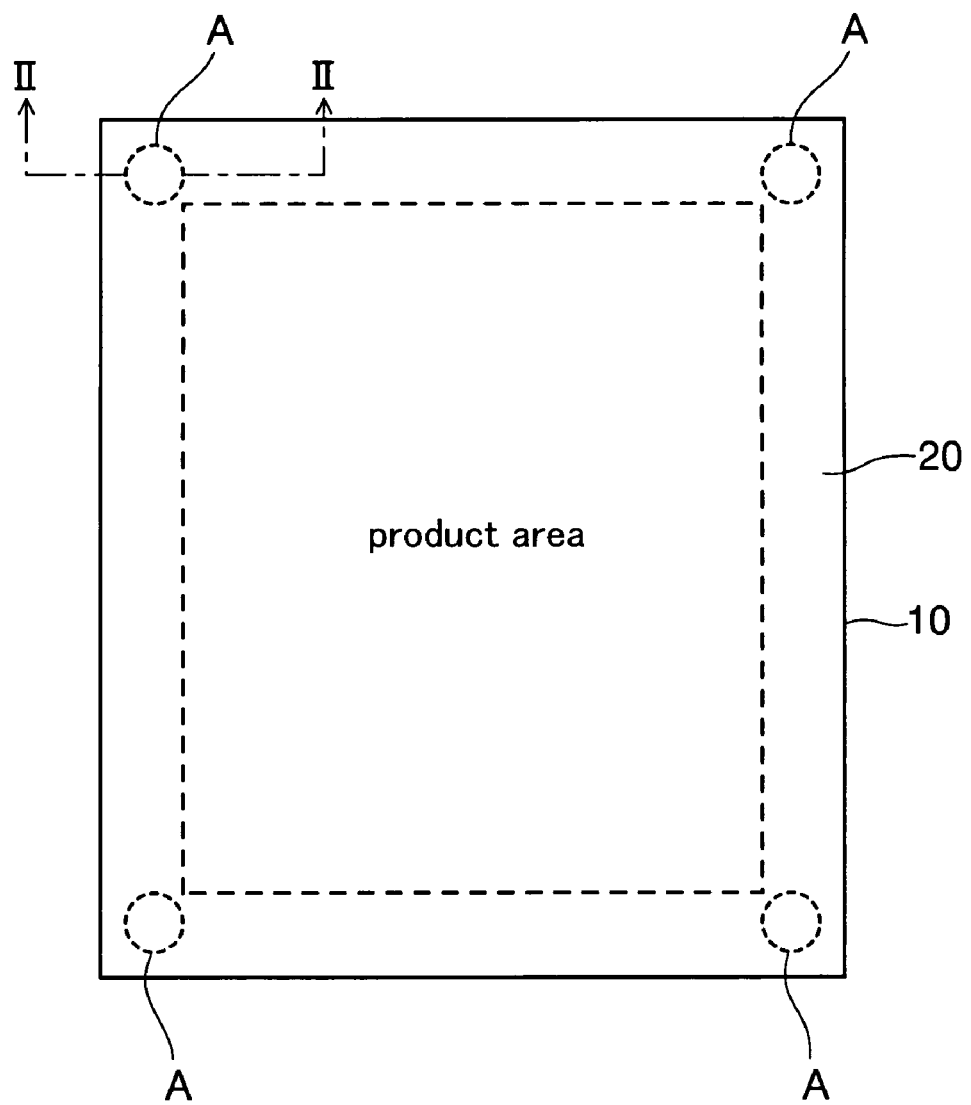

First, as shown in FIG. 3A, the laminated body 5 is obtained by pasting the carrier-lined copper foil 20 onto the supporting body 10 via the adhesive resin layer 12. Then, as shown in FIG. 3B, an area of the laminated body 5 that is one size larger than the portion in which the reference hole is arranged is heated at a temperature of 260 to 300° C. under the condition that this area is nipped from upper and lower sides by a pair of irons 6a, 6b that are also heated. Thus, as shown in FIG. 3C, the area of the carrier-lined copper foil 20 that is one size larger than the portion in which the reference hole is arranged is adhered perfectly, and thus a pressure-bonded portion A is obtained. As shown in FIG. 3D, when the overall structure of the laminated body 5 is viewed from the top side, the pressure-bonded portion A of the carrier-lined copper foil 20 is arranged at four corners on the outside of the product area of the supporting body 10. Also, the area except the pressure-bonded portions A are temporarily adhered to the extent that the copper foil 20b can be peeled, like the first embodiment.

Figure 3E:
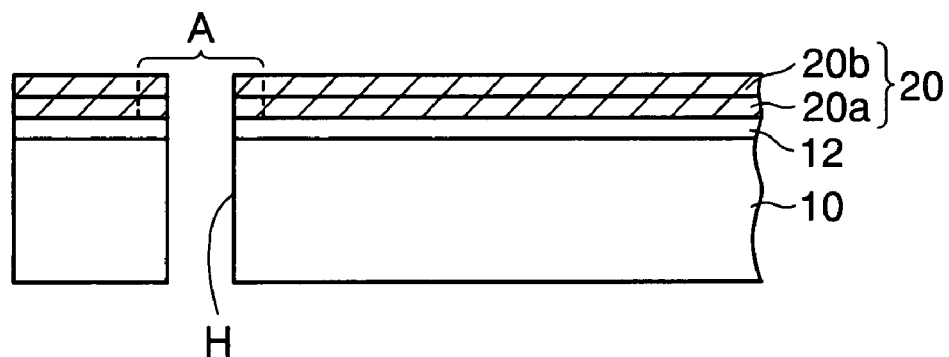
Figure 3F:
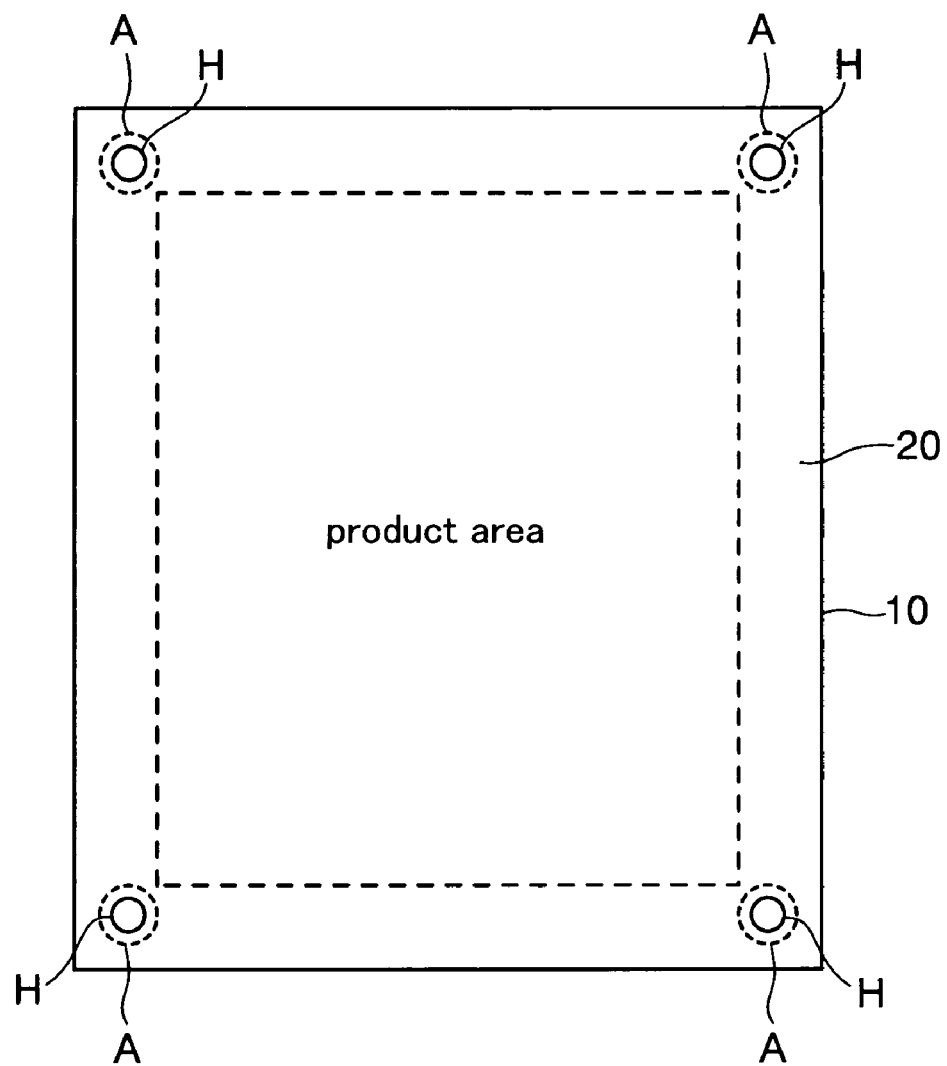

Then, as shown in FIG. 3E, a reference hole H is formed by applying the through-process to the portion of the laminated body 5, which corresponds to the area that is one size smaller than the pressure-bonded portion A of the carrier-lined copper foil 20, by the drill, or the like. Thus, as shown in FIG. 3F, when the overall structure of the laminated body 5 is viewed from the top side, the reference hole H is formed on the inner side of the pressure-bonded portions A of the carrier-lined copper foil 20 arranged at four corners of the supporting body 10 respectively. For example, when the reference hole H of about 2 mm diameter is formed, a diameter of the pressure-bonded portion A is set larger than such diameter by about 100 μm.

In the second embodiment, since the reference hole H is formed on the inner side of the pressure-bonded portions A of the carrier-lined copper foil 20, a sectional portion of the carrier-lined copper foil 20 exposed from the side surface of the reference hole H is still adhered perfectly even though such portion incurred the mechanical damage.

Figure 3G:
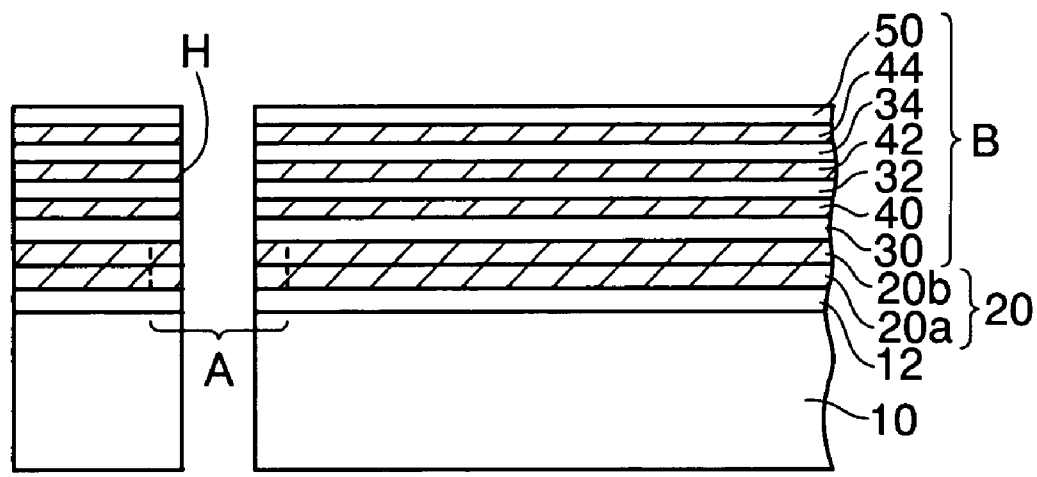

Then, as shown in FIG. 3G, like the first embodiment, a three-layered build-up wiring B, for example, is formed on the carrier-lined copper foil 20. In the step of forming the build-up wiring B, the resin layers and the wiring layers are formed such that the opening of the reference hole H is kept.

In the second embodiment, the sectional portion of the carrier-lined copper foil 20 is exposed from the side surface of the reference hole H, but the carrier copper foil 20a and the copper foil 20b of the carrier-lined copper foil 20 are adhered perfectly in the neighborhood of the reference hole H. Therefore, there is no possibility that the chemicals applied in the wet process in forming the build-up wiring B sink into the boundary, and the peeling of the carrier-lined copper foil 20 from the boundary can be prevented.

Figure 3H:
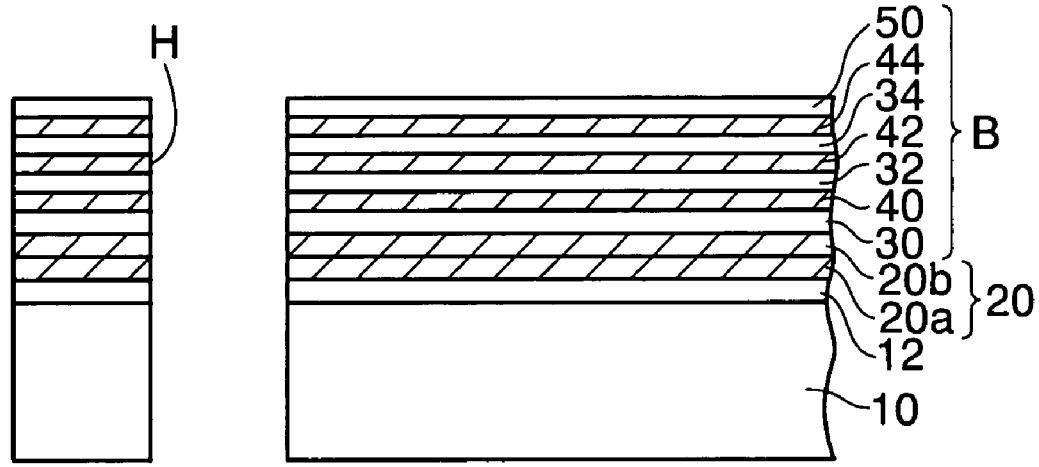

Then, the portion of the structural body in FIG. 3G corresponding to the area containing the pressure-bonded portion A of the carrier-lined copper foil 20 is processed/removed by the drill, or the like. Thus, as shown in FIG. 3H, the reference hole H is enlarged in diameter. Accordingly, the pressure-bonded portion A of the carrier-lined copper foil 20 is removed completely to expose the peeling boundary of the carrier-lined copper foil 20, and thus the copper foil 20b can be easily peeled from the carrier copper foil 20a at the boundary.

Figure 3I:
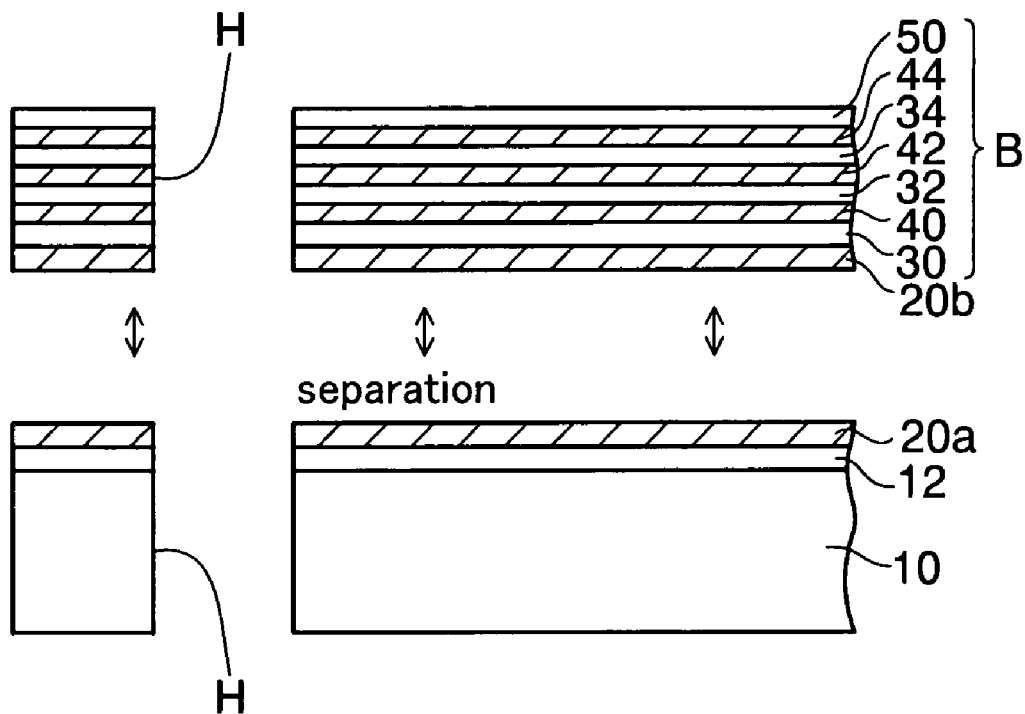
Figure 3J:
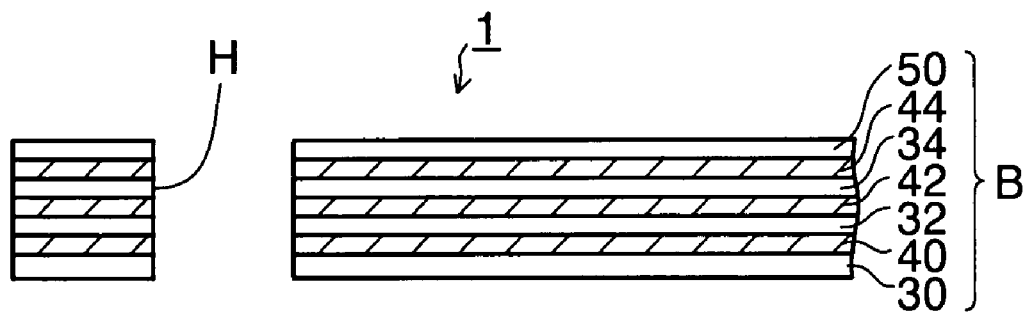

Then, as shown in FIG. 3I, the copper foil 20b and the build-up wiring B are separated from the supporting body 10 side by peeling the copper foil 20b from the carrier copper foil 20a of the carrier-lined copper foil 20 at the boundary. Then, as shown in FIG. 3J, the wiring substrate 1 of the present embodiment can be obtained by removing the copper foil 20b from the build-up wiring B.

In the second embodiment, the portion of the carrier-lined copper foil 20 pasted on the supporting body 10, which is one size larger than the portion in which the reference hole H is arranged, is thermally bonded previously to constitute the pressure-bonded portion A. Then, the reference hole H is formed in the portion of the carrier-lined copper foil 20 and the supporting body 10 on the inner side of the pressure-bonded portion A. Accordingly, the sectional portion of the carrier-lined copper foil 20 exposed from the side surface of the reference hole H is still adhered perfectly even though the mechanical damage is applied in forming the reference hole H. Therefore, there is no possibility that the chemicals applied in the wet process in forming the build-up wiring B sink into the boundary of the carrier-lined copper foil 20, and the peeling of the carrier-lined copper foil 20 from the boundary can be prevented.

Also, the peeling boundary of the carrier-lined copper foil 20 is exposed by removing the area containing the pressure-bonded portion A of the carrier-lined copper foil 20 after the build-up wiring B is formed. Therefore, the copper foil 20b can be peeled from the carrier copper foil 20a at the boundary, and the thin wiring substrate 1 can be easily obtained.

In the second embodiment, the variation or the change similar to those in the first embodiment may be applied.

Third Embodiment

FIGS. 4A to 4I and FIGS. 5A and 5B are views showing a method of manufacturing of a wiring substrate according to a third embodiment of the present invention. In the first and second embodiments, the peeling from the portion of the carrier-lined copper foil exposed from the side surface of the reference hole can be prevented, but the carrier-lined copper foil must be cut to coincide with a size of the supporting body. Therefore, there is a possibility that the outer peripheral portion is damaged by the machining in the cutting, and such a situation is supposed that such outer peripheral portion is easily peeled in forming the build-up wiring, like the side surface of the reference hole.

A feature of the third embodiment is that the peeling can be prevented not only in the side surface of the reference hole of the carrier-lined copper foil but also in the outer peripheral portion.

Figure 4A:
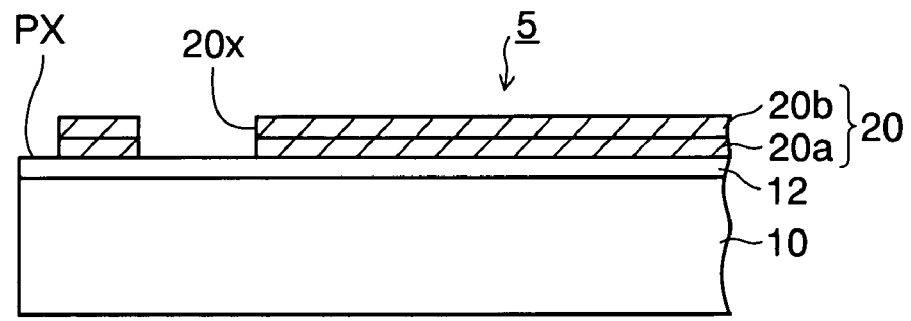
Figure 4B:
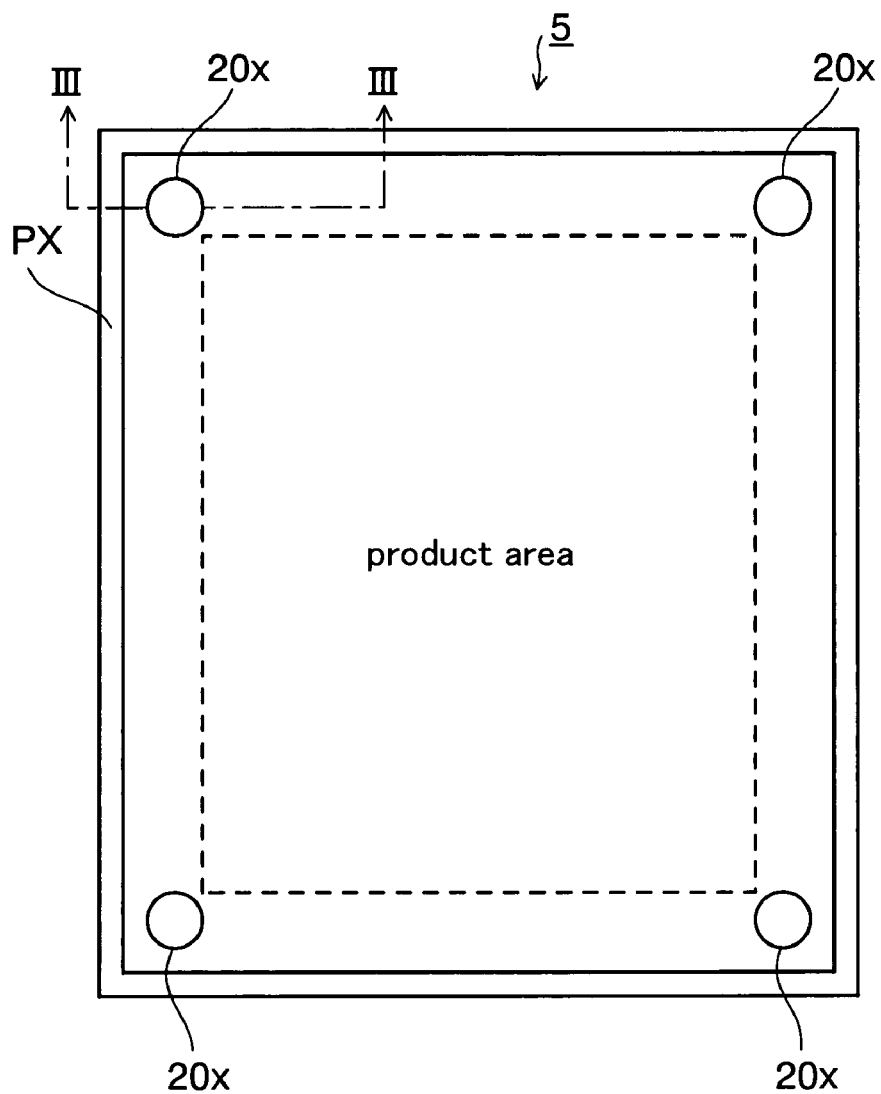

At first, the method of preventing further the peeling of the outer peripheral portion of the carrier-lined copper foil in the foregoing first embodiment is explained. As shown in FIG. 4A, first, the carrier-lined copper foil 20 in which the opening portion 20x that is one size larger in diameter than the reference hole is provided and which is one size smaller in size than the supporting body 10 is prepared. Then, the laminated body 5 is obtained by pasting the carrier-lined copper foil 20 onto the supporting body 10 via the adhesive resin layer 12. As shown in FIG. 4B, when the overall structure of the laminated body 5 is viewed from the top side, the outer peripheral portion of the carrier-lined copper foil 20 is arranged to retreat inward from the outer peripheral portion of the supporting body 10, and the outer peripheral portion of the supporting body 10 constitutes a projection portion PX, and also the opening portion 20x of the carrier-lined copper foil 20 is arranged at four corners of the supporting body 10.

Figure 4C:
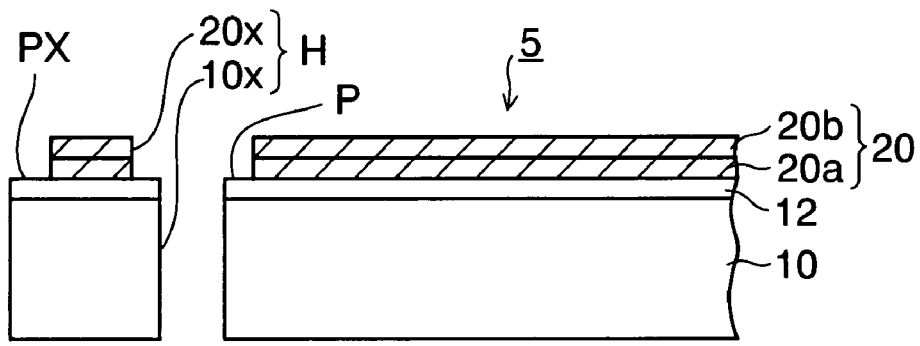
Figure 4D:
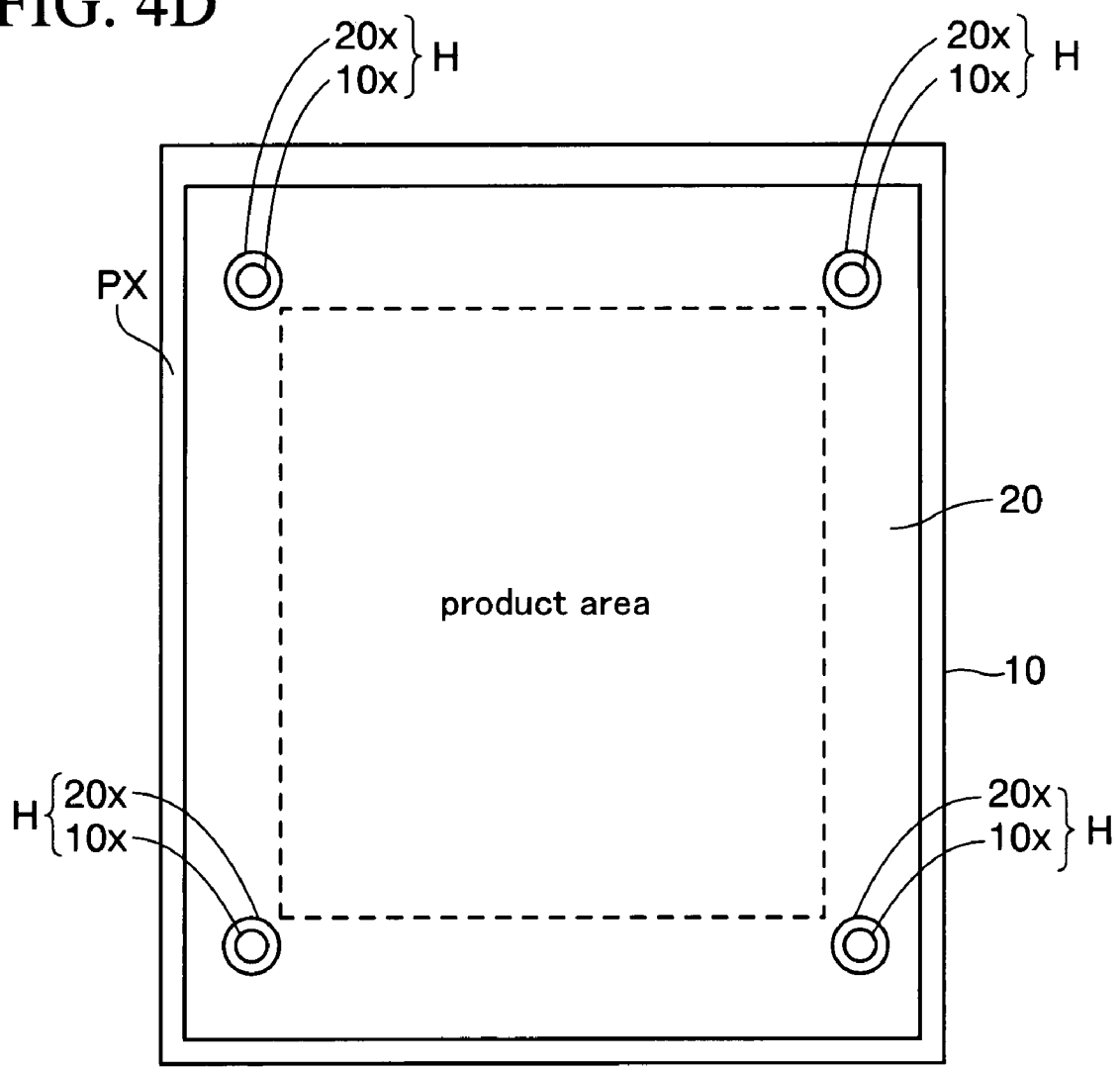

Then, as shown in FIGS. 4C and 4D, like the first embodiment, the portion of the adhesive resin layer 12 and the supporting body 10 on the inner side of the opening portion 20x of the carrier-lined copper foil 20 are processed by the drill, or the like. Thus, the first reference hole H1 having the projection portion P in the inside that is constructed by the through hole 10x of the supporting body 10 and the opening portion 20x of the carrier-lined copper foil 20 is formed at four corners of the laminated body 5.

Then, as shown in FIG. 4E, like the first embodiment, the first resin layer 30 is formed on the carrier-lined copper foil 20 such that the second reference hole H2 that communicates with the through hole 10x of the first reference hole H1 is opened. At this time, the side surface of the opening portion 20x of the carrier-lined copper foil 20 is covered with the first resin layer 30 and simultaneously the side surface of the outer peripheral portion of the carrier-lined copper foil 20 is covered with the first resin layer 30. Accordingly, in the third embodiment, all sectional portions of the carrier-lined copper foil 20 (the peeling boundary of the carrier copper foil 20a and the copper foil 20b) are covered/protected with the first resin layer 30.

Then, as shown in FIG. 4F, like the first embodiment, the three-layered build-up wiring B, for example, is formed. At this time, not only the side surface of the opening portion 20x of the carrier-lined copper foil 20 but also the side surface of the outer peripheral portion of the carrier-lined copper foil 20 is covered with the first resin layer 30. Therefore, there is no possibility that the chemicals applied in the wet process in forming the build-up wiring B sink into the peeling boundary of the carrier-lined copper foil 20, and the peeling of the carrier-lined copper foil 20 can be prevented.

In this event, instead of covering the side surface of the outer peripheral portion of the carrier-lined copper foil 20 with the first resin layer 30, the side surface may be coated with a resist film used in a step of forming the first wiring layer 40, and then the side surface may be coated with the second resin layer 32 after the resist film is removed.

Figure 4G:
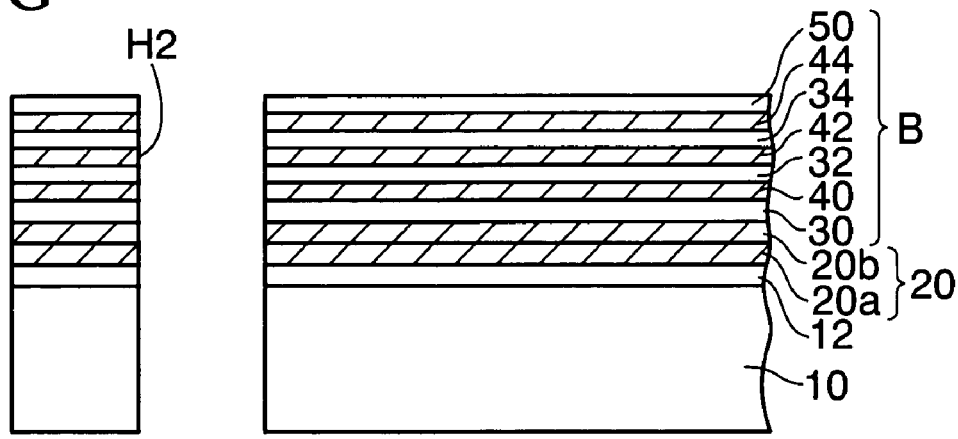

Then, as shown in FIG. 4G, like the first embodiment, the second reference hole H2 is enlarged in diameter by removing the portion of the structural body in FIG. 4F corresponding to the area containing the opening portion 20x of the carrier-lined copper foil 20. Then, as also shown in FIG. 4G, the peeling boundary of the outer peripheral portion of the carrier-lined copper foil 20 is exposed by removing the portion of the structural body in FIG. 4F corresponding to the area containing the projection portion PX on the outer peripheral side of the supporting body 10 by cutting by means of the router, or the like, and thus the carrier-lined copper foil 20 is brought into such a condition that the copper foil 20b can be easily peeled from the carrier copper foil 20a at the boundary.

Figure 4H:
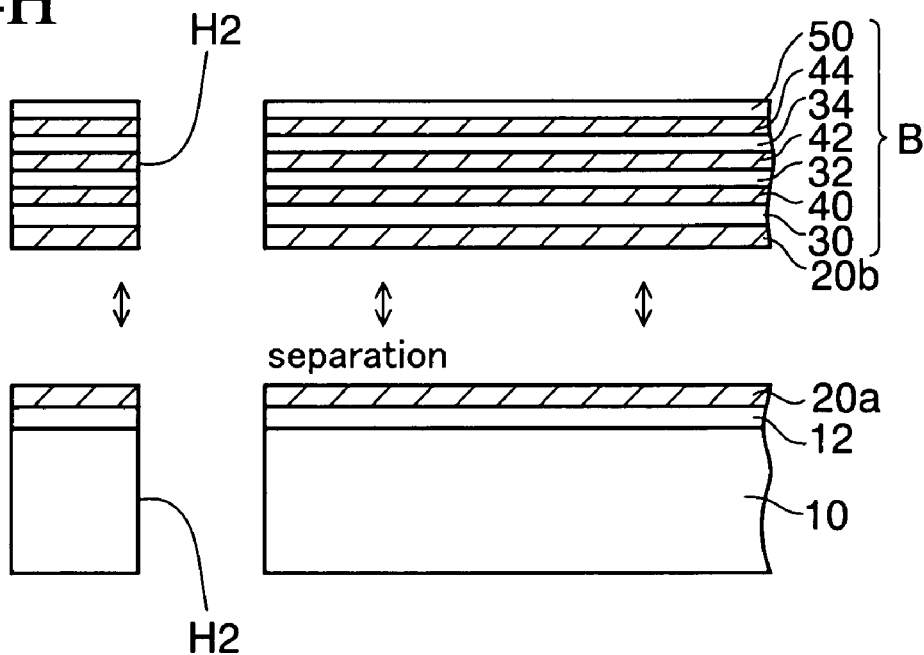
Figure 4I:
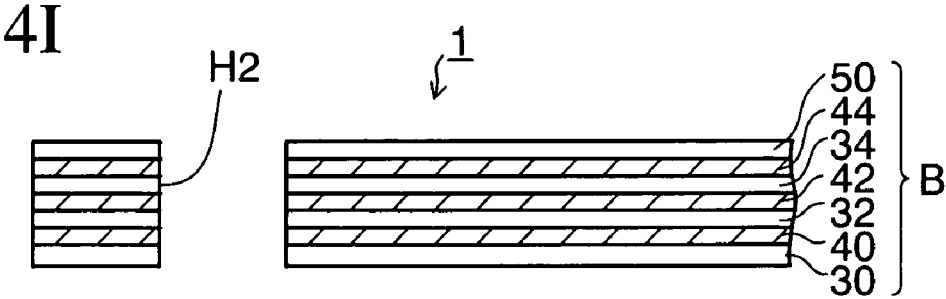

Then, as shown in FIG. 4H, the copper foil 20b and the build-up wiring B are separated from the supporting body 10 side by peeling the copper foil 20b from the carrier copper foil 20a at the boundary. Then, as shown in FIG. 4I, the wiring substrate 1 of the present embodiment can be obtained by removing the copper foil 20b from the build-up wiring B.

In the third embodiment, the similar advantages to the first embodiment can be achieved. In addition, in the third embodiment, not only the side surface of the opening portion 20x of the carrier-lined copper foil 20 but also the side surface of the outer peripheral portion is covered/protected with the first resin layer 30. Accordingly, even when the side surface of the outer peripheral portion of the carrier-lined copper foil 20 is going to peel due to the mechanical damage, the spread of the peeling in the step of forming the build-up wiring B can be prevented and also a production yield can be further improved.

Next, a method of preventing further the peeling of the outer peripheral portion of the carrier-lined copper foil in the second embodiment will be explained hereunder.

Figure 5A:
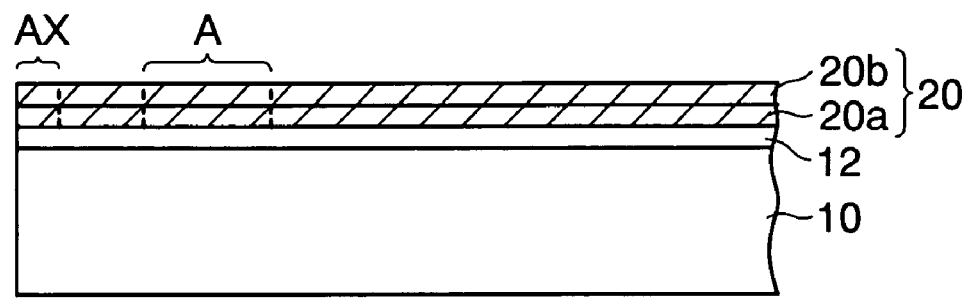
FIGS. 5A and 5B are a sectional view and a plan view showing another method of manufacturing a wiring substrate according to the third embodiment of the present invention.
Figure 5B:
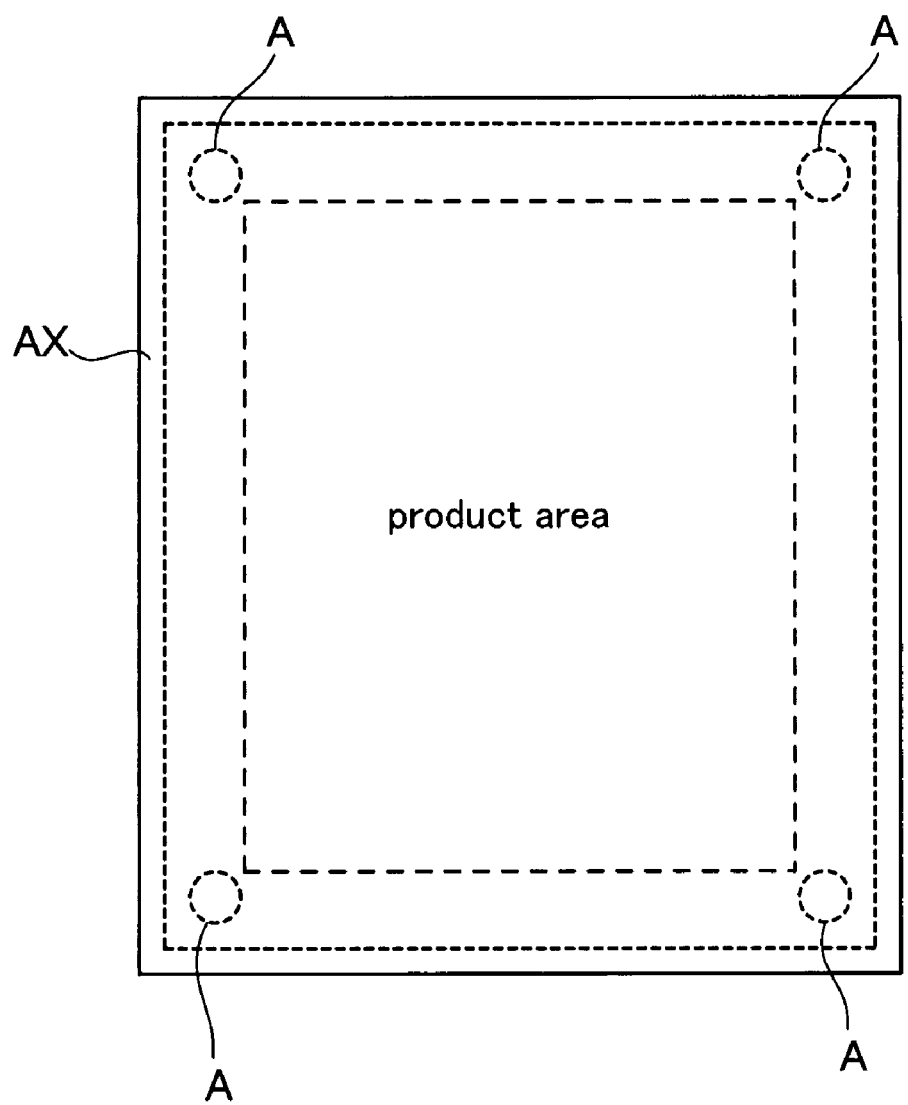

As shown in FIGS. 5A and 5B, an outer peripheral pressure-bonded portion AX is further formed by pressure-bonding the outer peripheral portion of the carrier-lined copper foil 20, besides the area in which the reference hole H is formed, in the pressure-bonding step in FIG. 3B in the second embodiment.

Then, the steps in FIGS. 3E, 3F, 3G in the second embodiment are carried out. Then, in the step in FIG. 3H, the peeling boundary of the carrier-lined copper foil 20 is exposed by cutting/removing the portion of the build-up wiring B and the laminated body 5 corresponding to the outer peripheral pressure-bonded portion AX besides the pressure-bonded portion A by the router, or the like. Then, as in FIGS. 3I and 3J in the second embodiment, the copper foil 20b and the build-up wiring B are separated from the supporting body 10 side by peeling the copper foil 20b from the carrier copper foil 20a at the boundary, and then the copper foil 20b is removed.

Accordingly, in the above second embodiment, the outer peripheral portion of the carrier-lined copper foil 20 is adhered perfectly prior to the formation of the build-up wiring B by adding the technical idea in the third embodiment, and therefore a possibility of the sinking of the chemicals can be eliminated and the peeling can be prevented.

In the present embodiment, a mode in which the sectional surface of the outer peripheral portion of the carrier-lined copper foil 20 in the first embodiment is covered further with the first resin layer 30 is explained. In this case, the peeling of the outer peripheral portion of the carrier-lined copper foil 20 may be prevented by combining the method in which the outer peripheral pressure-bonded portion is formed in the outer peripheral portion of the carrier-lined copper foil 20 with the first embodiment.

Also, in the present embodiment, a mode in which the outer peripheral pressure-bonded portion is further formed on the outer peripheral portion of the carrier-lined copper foil 20 in the second embodiment is explained. In this case, the peeling of the outer peripheral portion of the carrier-lined copper foil 20 may be prevented by combining the method in which the outer peripheral portion of the carrier-lined copper foil 20 is covered with the resin layer with the second embodiment.

Fourth Embodiment

FIGS. 6A to 6G are views showing a method of manufacturing a wiring substrate according to a fourth embodiment of the present invention. A feature of the fourth embodiment resides in that the carrier-lined copper foil and the build-up wiring are formed on both surface sides of the supporting body respectively and also the build-up wiring is obtained from both surface sides of the supporting body respectively. In the fourth embodiment, the case where the technical idea in the first embodiment is employed is exemplified, and detailed explanation of the same steps as the first embodiment is omitted herein.

Figure 6A:
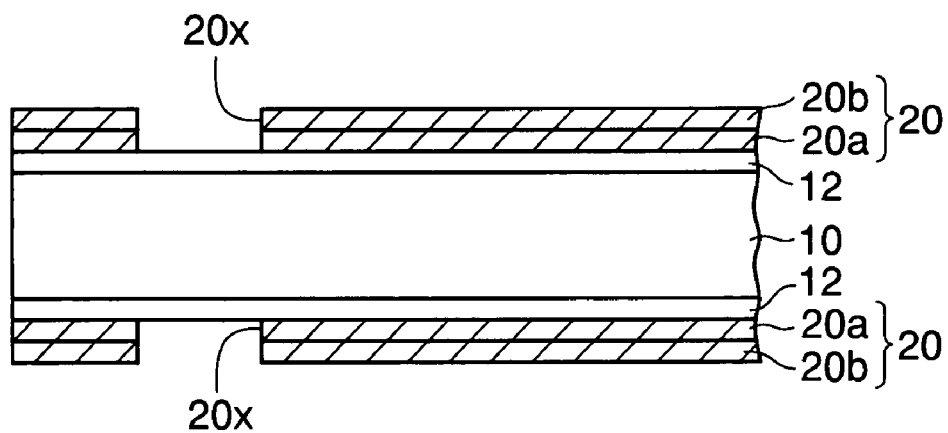
FIGS. 6A to 6G are sectional views showing a method of manufacturing a wiring substrate according to a fourth embodiment of the present invention.
Figure 6B:
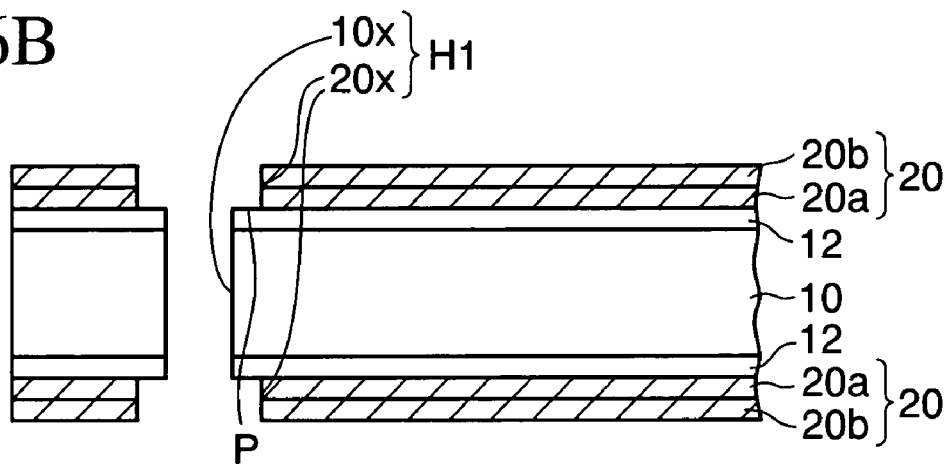

As shown in FIG. 6A, first, the carrier-lined copper foil 20 in which the opening portions 20x are provided in the peripheral portion (four corners) is pasted onto both side surfaces of the supporting body 10 via the adhesive resin layer 12 respectively by the same method as the first embodiment. Then, as shown in FIG. 6B, like the first embodiment, the through hole 10x that is smaller in diameter than the opening portion 20x of the carrier-lined copper foil 20 is formed in the portion of the adhesive resin layer 12 and the supporting body 10 on the inner side of the opening portion 20x of the carrier-lined copper foil 20. Accordingly, the first reference hole H1 constructed by respective opening portions 20x in the carrier-lined copper foils 20 on both surface sides of the supporting body 10 and the through hole 10x of the supporting body 10 is formed, and the projection portions P are provided in the inside of the first reference hole H1.

Figure 6C:
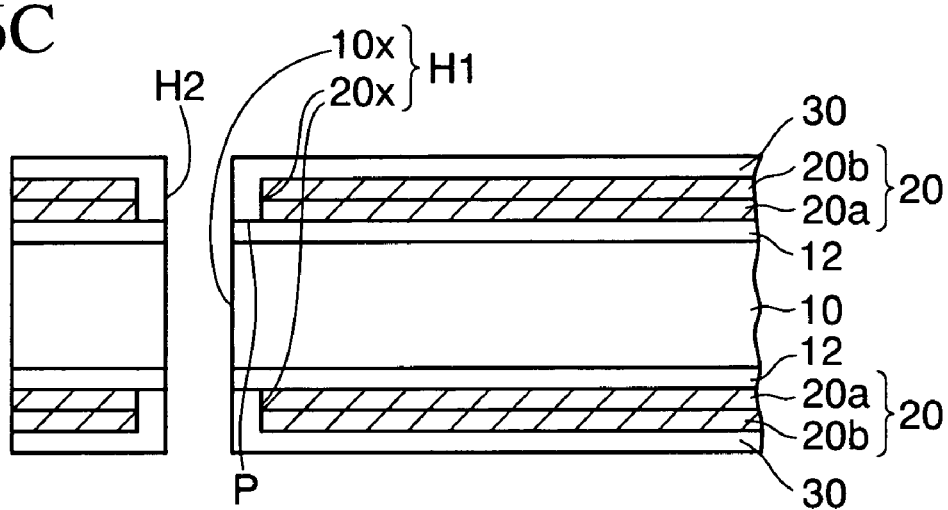

Then, as shown in FIG. 6C, the first resin layer 30 is formed on the carrier-lined copper foil 20 on both surface sides of the supporting body 10 respectively such that the second reference hole H2 that communicates with the through hole 10x of the first reference hole H1 is opened. At this time, like the first embodiment, the first resin layer 30 is formed on the projection portion P in the first reference hole H1, and the side surface of the opening portion 20x of the carrier-lined copper foil 20 on both surface sides of the supporting body 10 is covered/protected with the first resin layer 30.

Figure 6D:
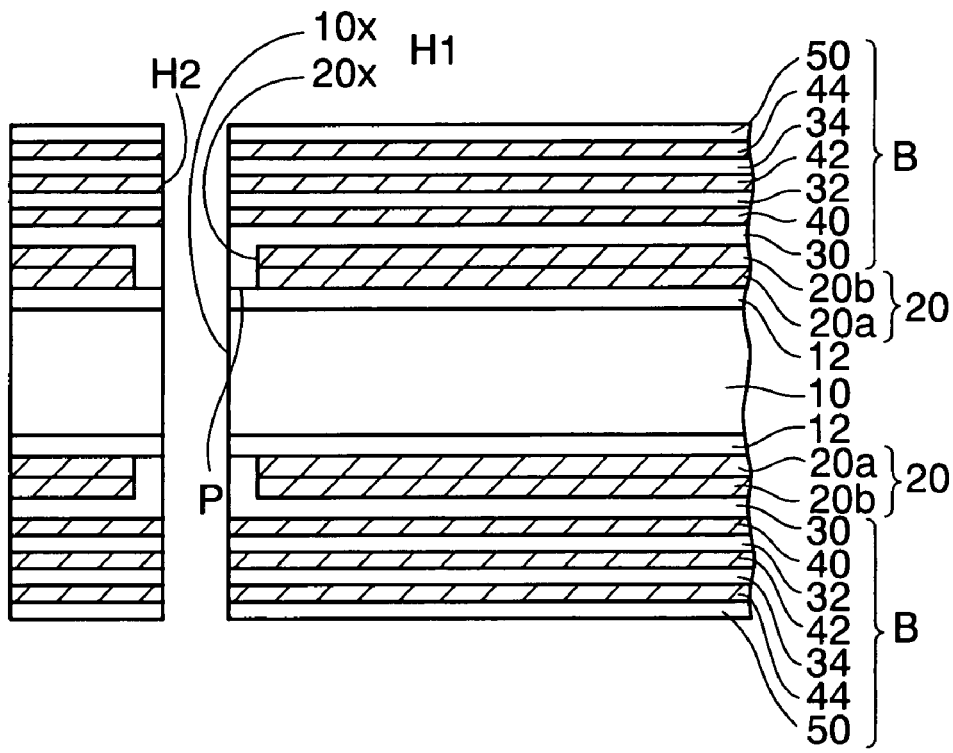

Then, as shown in FIG. 6D, the build-up wiring B similar to that in the first embodiment is formed on the first resin layer 30 on both surface sides of the supporting body 10 respectively. At this time, the resin layers and the wiring layers are formed such that the opening of the second reference hole H2 is still kept in respective steps.

Figure 6E:
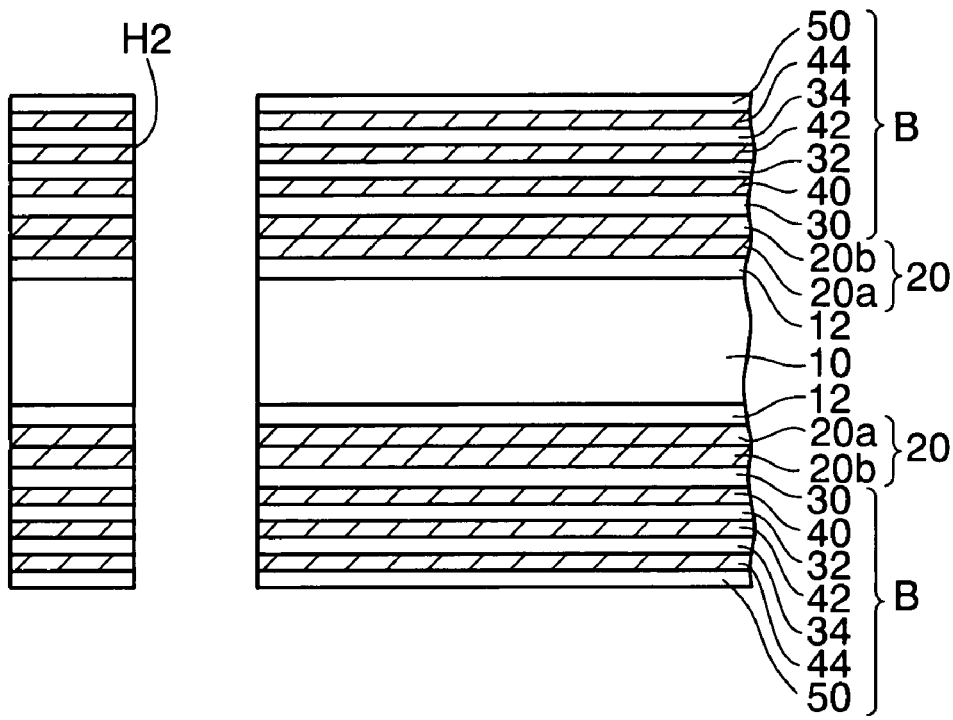

Then, as shown in FIG. 6E, like the first embodiment, the second reference hole H2 is enlarged in diameter by removing the portion of the structural body in FIG. 6D corresponding to the area containing the opening portion 20x of the carrier-lined copper foil 20.

Figure 6F:
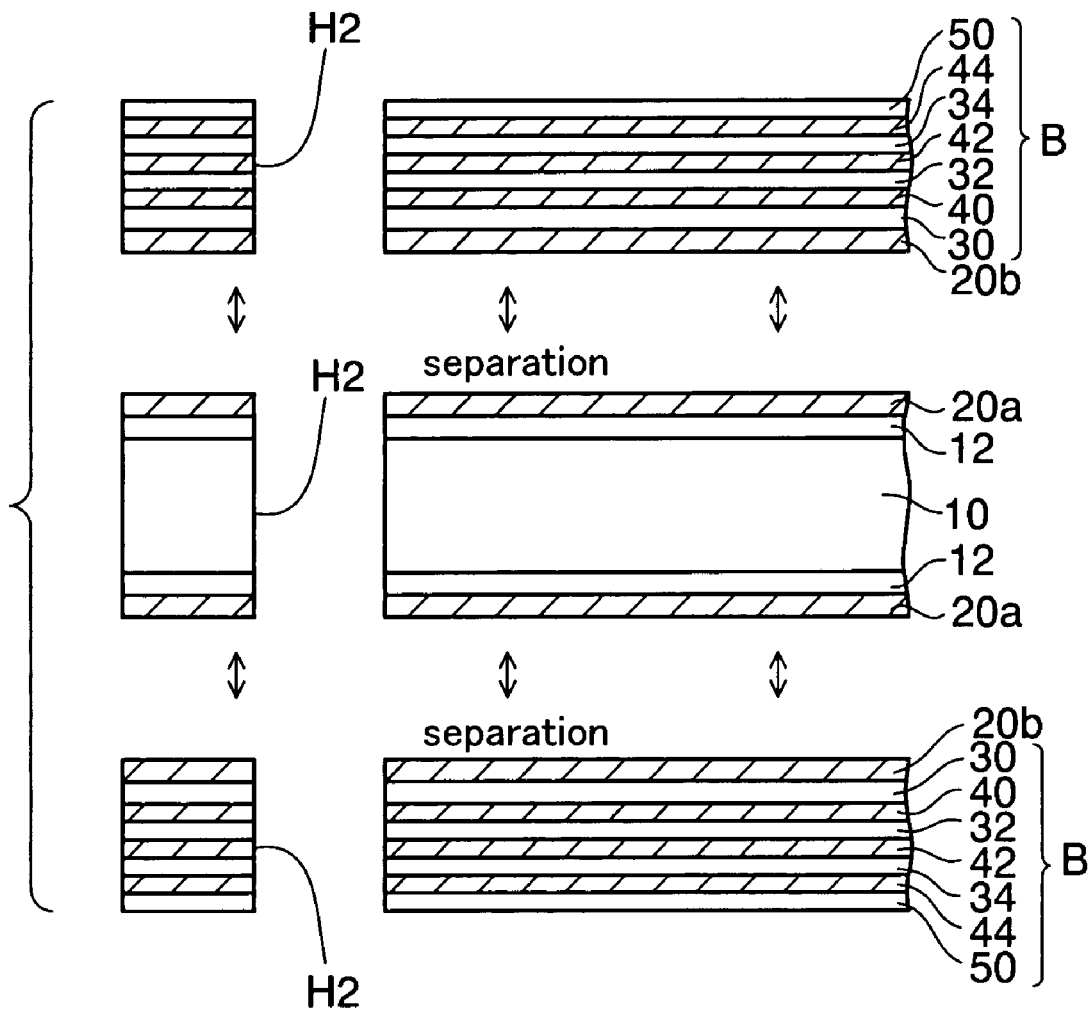

Then, as shown in FIG. 6F, the copper foil 20b is peeled from the carrier copper foil 20a of the carrier-lined copper foil 20 at the boundary on both surface sides of the supporting body 10 respectively. Thus, the copper foil 20b and the build-up wiring B are separated from both surface sides of the supporting body 10 respectively.

Figure 6G:
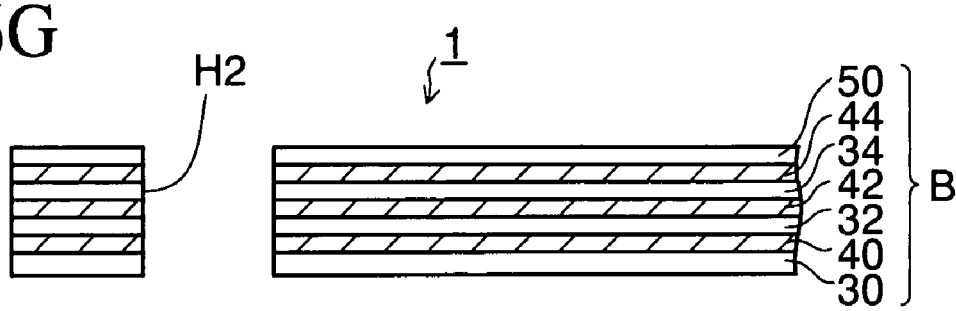

Then, as shown in FIG. 6G, the wiring substrate 1 of the resent embodiment can be obtained by removing the copper foil 20b from the build-up wiring B.

The fourth embodiment can achieve the similar advantages to the first embodiment.

In this case, the carrier-lined copper foil and the build-up wiring may be formed on both surface sides of the supporting body by the technical ideas in the second embodiment and the third embodiment.

What is claimed is:

1. A method of manufacturing a wiring substrate, comprising the steps of:
   preparing a laminated body having such a structure that a peelable metal foil in which a lower metal foil and an upper metal foil are laminated peelably and an opening portion is provided on a peripheral side is pasted onto a supporting body;
   forming a through hole having a diameter smaller than the opening portion by processing a portion of the supporting body on an inner side of the opening portion to obtain a reference hole having a projection portion in an inside;
   forming a resin layer on the peelable metal foil and the projection portion in the reference hole to cover a side surface of the opening portion, and then forming a build-up wiring constructed to contain the resin layer;
   removing portions of the build-up wiring and the laminated body corresponding to an area containing the opening portion to expose a peeling boundary of the peelable metal foil;
   peeling the upper metal foil from the lower metal foil at the peeling boundary to separate the upper metal foil and the build-up wiring from the supporting body side; and
   removing the upper metal foil from the build-up wiring.

2. A method of manufacturing a wiring substrate, comprising the steps of:
   obtaining a laminated body by pasting a peelable metal foil constructed by laminating an upper metal foil and a lower metal foil in a peelable state onto a supporting body;
   forming a pressure-bonded portion by thermally bonding a predetermined portion of a peripheral side of the peelable metal foil selectively;

forming a reference hole passing through the laminated body, by processing a portion of the laminated body on an inner side of the pressure-bonded portion such that a peripheral side of the pressure-bonded portion is left;

forming a build-up wiring on the peelable metal foil;

removing portions of the build-up wiring and the laminated body corresponding to an area containing the pressure-bonded portion to expose a peeling boundary of the peelable metal foil;

peeling the upper metal foil from the lower metal foil at the peeling boundary to separate the upper metal foil and the build-up wiring from the supporting body side; and removing the upper metal foil from the build-up wiring.

3. A method of manufacturing a wiring substrate according to claim 1, wherein the step of preparing the laminated body includes the step of pasting the peelable metal foil in which the opening portion is provided onto the supporting body.

4. A method of manufacturing a wiring substrate according to claim 1, wherein the step of preparing the laminated body includes the steps of:

pasting the peelable metal foil onto the supporting body, and patterning the peelable metal foil to obtain the opening portion.

5. A method of manufacturing a wiring substrate according to claim 1, wherein, in the step of preparing the laminated body, an outer peripheral portion of the peelable metal foil is arranged to retreat inward from the outer peripheral portion of the supporting body such that a projection portion is provided to the outer peripheral portion of the supporting body, a side surface of the outer peripheral portion of the peelable metal foil is covered with the resin layer in the step of forming the resin layer, and in the step of exposing a peeling boundary of the peelable metal foil, the build-up wiring and the laminated body corresponding to an area containing the projection portion on the outer peripheral portion of the supporting body are further removed.

6. A method of manufacturing a wiring substrate according to claim 2, wherein, in the step of forming the pressure-bonded portion, an outer peripheral pressure-bonded portion is further formed on the outer peripheral portion of the peelable metal foil, and in the step of exposing the peeling boundary of the peelable metal foil, portions of the build-up wiring and the laminated body corresponding to an area containing the outer peripheral pressure-bonded portion are removing by cutting.

7. A method of manufacturing a wiring substrate according to claim 1 or 2, wherein the peelable metal foil and the build-up wiring are formed on both surface sides of the supporting body, and the build-up wiring is obtained from both surface sides of the supporting body.

8. A method of manufacturing a wiring substrate according to claim 1 or 2, wherein the lower metal foil and the upper metal foil are made of copper.

9. A method of manufacturing a wiring substrate according to claim 1 or 2, wherein the reference hole is formed in an outer area of a product area of the laminated body.

10. A method of manufacturing a wiring substrate according to claim 1 or 2, wherein the reference hole is utilized for alignment and conveyance at time of forming the build-up wiring.

* * * * *